(12) United States Patent
Anderson et al.

(10) Patent No.: US 8,946,027 B2
(45) Date of Patent: Feb. 3, 2015

(54) REPLACEMENT-GATE FINFET STRUCTURE AND PROCESS

(75) Inventors: Brent A. Anderson, Jericho, VT (US);
Andres Bryant, Burlington, VT (US);
Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 172 days.

(21) Appl. No.: 13/367,725

(22) Filed: Feb. 7, 2012

(65) Prior Publication Data
US 2013/0200454 A1    Aug. 8, 2013

(51) Int. Cl.
H01L 21/336    (2006.01)

(52) U.S. Cl.
USPC ......................................... 438/282; 438/296

(58) Field of Classification Search
USPC ......................................... 257/347; 438/158
See application file for complete search history.

(56) References Cited

U.S. PATENT DOCUMENTS

| | | | |
|---|---|---|---|
| 6,413,802 B1 | 7/2002 | Hu et al. | |
| 6,642,090 B1 | 11/2003 | Fried et al. | |
| 6,885,055 B2 | 4/2005 | Lee | |
| 7,101,763 B1 | 9/2006 | Anderson et al. | |
| 7,262,084 B2 | 8/2007 | Zhu et al. | |
| 7,352,018 B2 | 4/2008 | Specht et al. | |
| 7,560,358 B1 | 7/2009 | Kim et al. | |
| 7,772,048 B2 | 8/2010 | Jones et al. | |
| 7,800,152 B2 | 9/2010 | Zhu et al. | |
| 2006/0029887 A1 | 2/2006 | Oh et al. | |
| 2007/0102756 A1 | 5/2007 | Lojek | |
| 2008/0237641 A1* | 10/2008 | Oh et al. | 257/194 |
| 2009/0001464 A1* | 1/2009 | Booth et al. | 257/347 |
| 2009/0114979 A1* | 5/2009 | Schulz | 257/327 |
| 2010/0167475 A1 | 7/2010 | Nara | |
| 2010/0314684 A1 | 12/2010 | Sonsky et al. | |
| 2011/0045648 A1 | 2/2011 | Knorr et al. | |
| 2011/0068431 A1 | 3/2011 | Knorr et al. | |
| 2012/0104472 A1 | 5/2012 | Xu et al. | |

OTHER PUBLICATIONS

Kim et al., "Silicon on Replacement Insulator (SRI) Floating Body Cell (FBC) Memory," IEEE Symposium on VLSI Technology Digest of Technical Papers, 2010, pp. 165-166.
GB Application No. GB1311356.8, Search Report dated Oct. 31, 2013, 3 pages.

* cited by examiner

*Primary Examiner* — Kevin Parendo
(74) *Attorney, Agent, or Firm* — Gibb & Riley, LLC; Michael J. Lestrange, Esq.

(57) ABSTRACT

A fin field effect transistor (FinFET) structure and method of making the FinFET including a silicon fin that includes a channel region and source/drain (S/D) regions, formed on each end of the channel region, where an entire bottom surface of the channel region contacts a top surface of a lower insulator and bottom surfaces of the S/D regions contact first portions of top surfaces of a lower silicon germanium (SiGe) layer. The FinFET structure also includes extrinsic S/D regions that contact a top surface and both side surfaces of each of the S/D regions and second portions of top surfaces of the lower SiGe layer. The FinFET structure further includes a replacement gate or gate stack that contacts a conformal dielectric, formed over a top surface and both side surfaces of the channel region.

12 Claims, 23 Drawing Sheets

X1-X1'

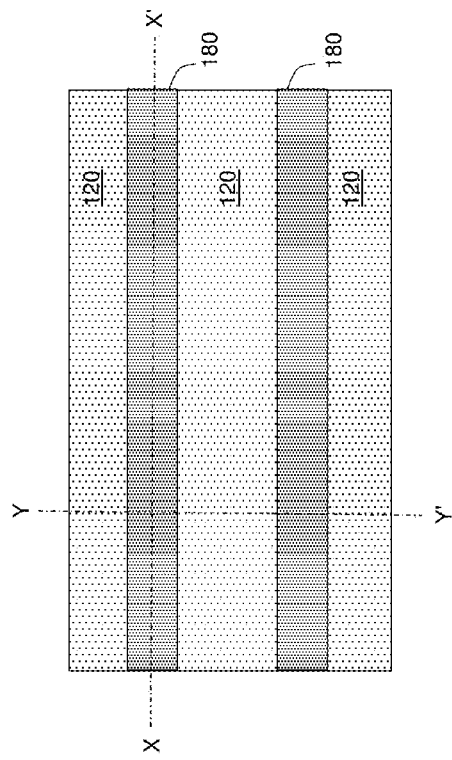
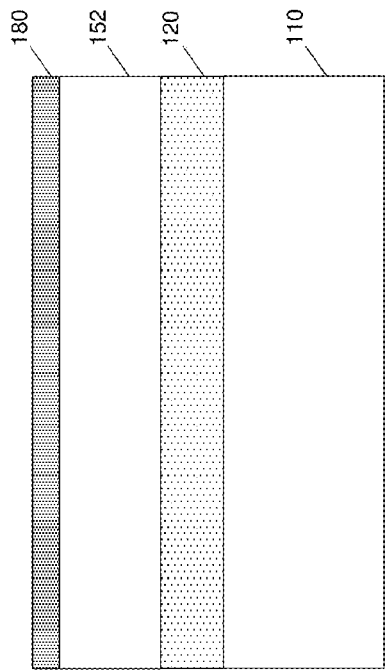
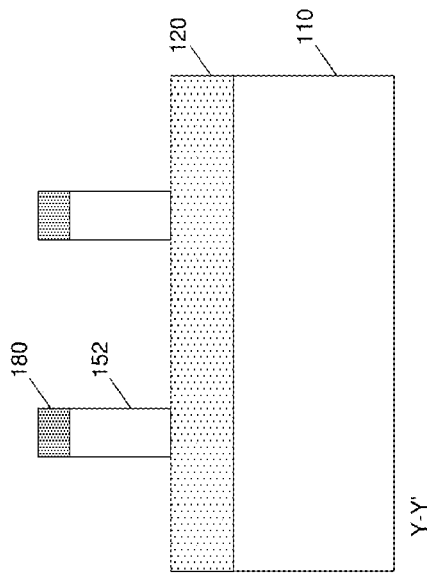
FIG. 2A
FIG. 2B
FIG. 2C

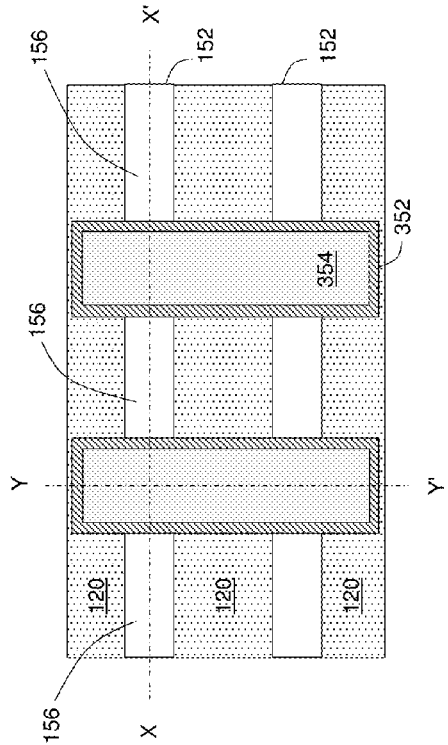
FIG. 3A
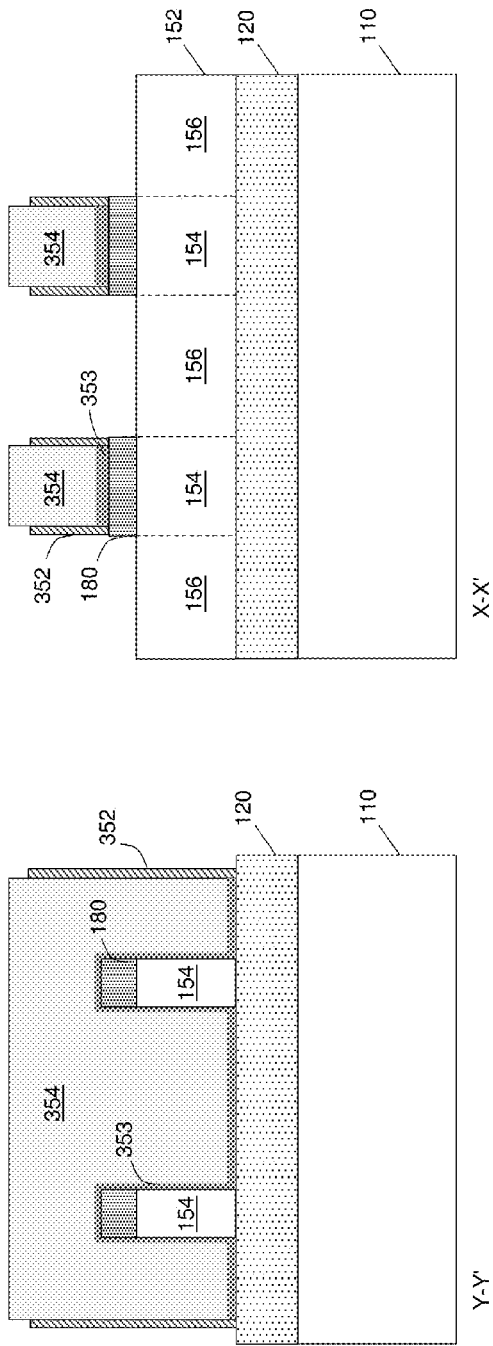
FIG. 3B
FIG. 3C

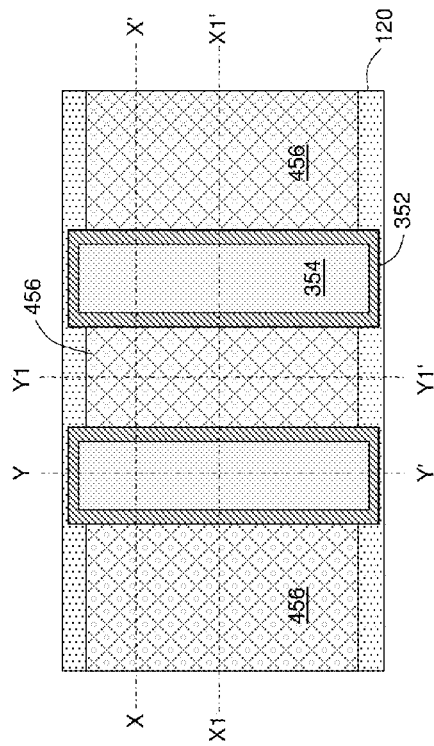
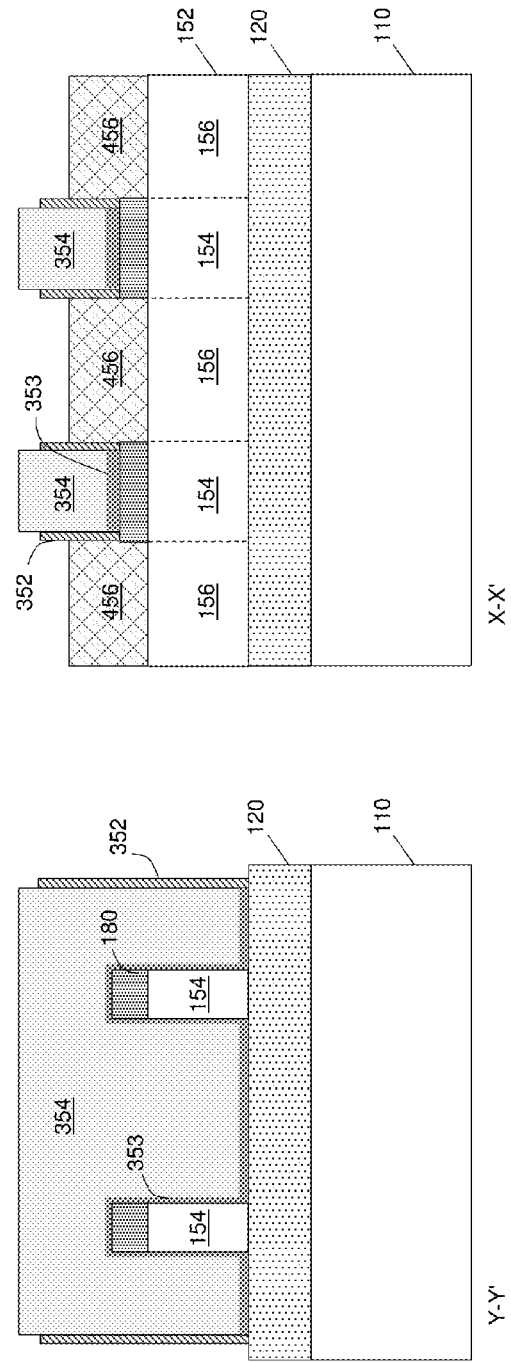
FIG. 4A
FIG. 4B
FIG. 4C

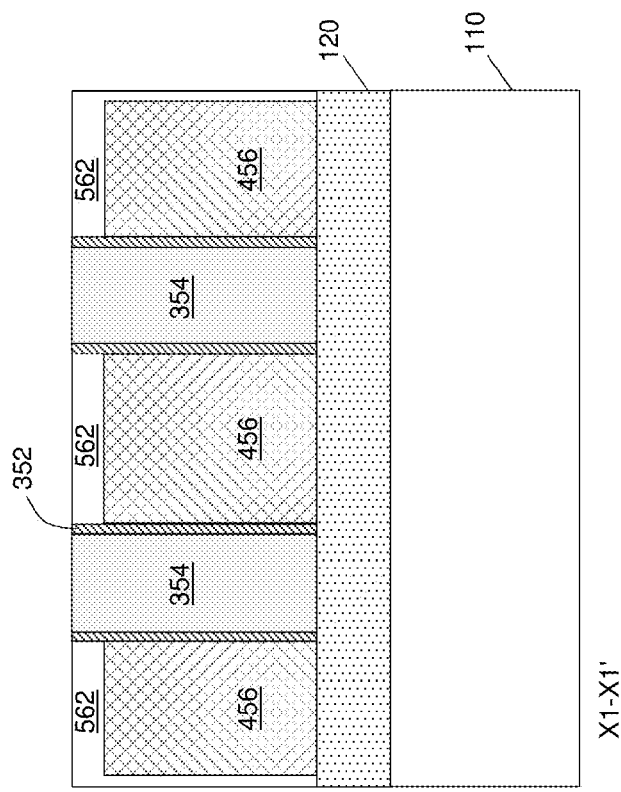
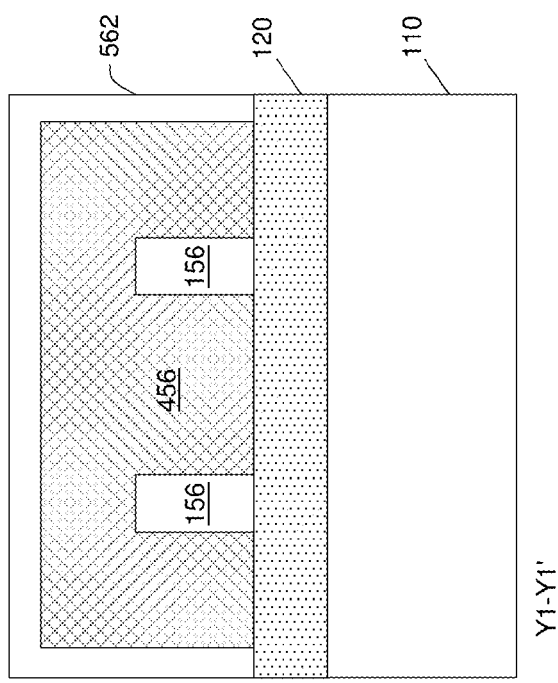
FIG. 5E
FIG. 5D

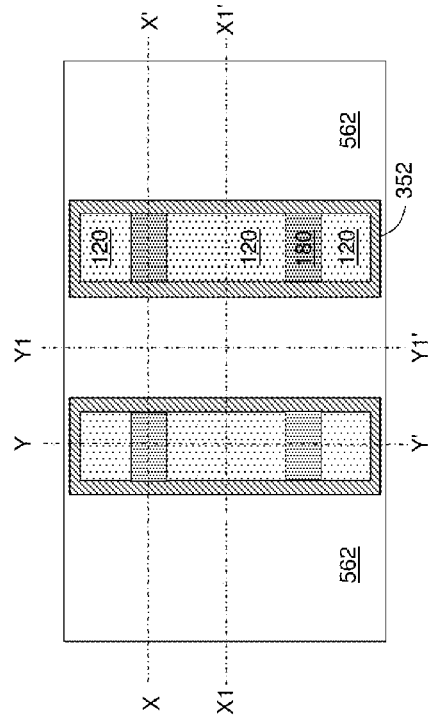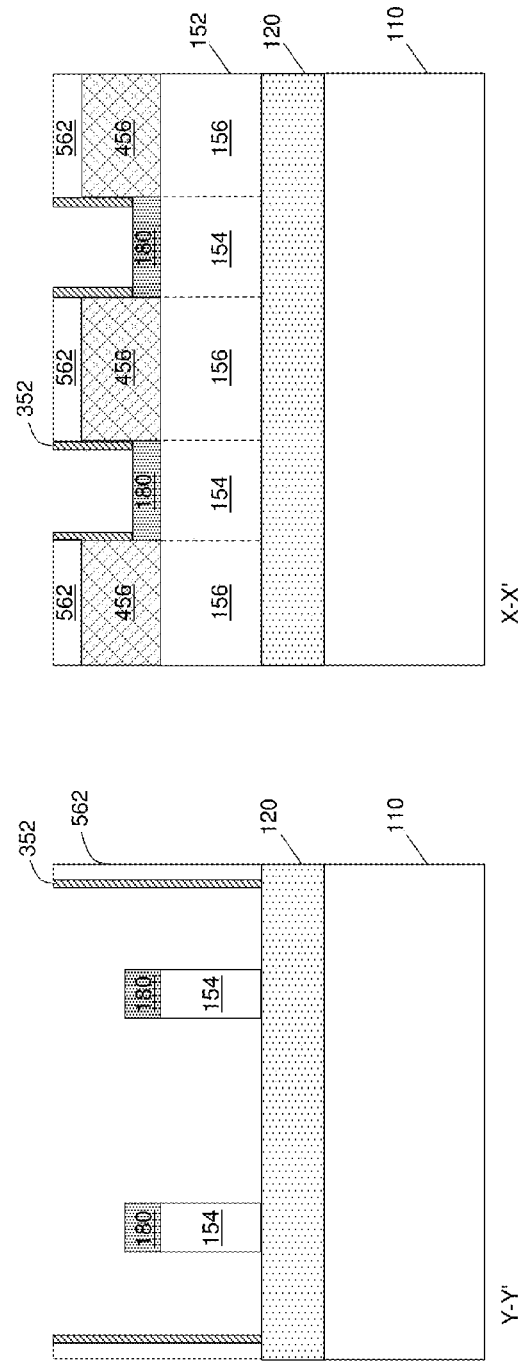

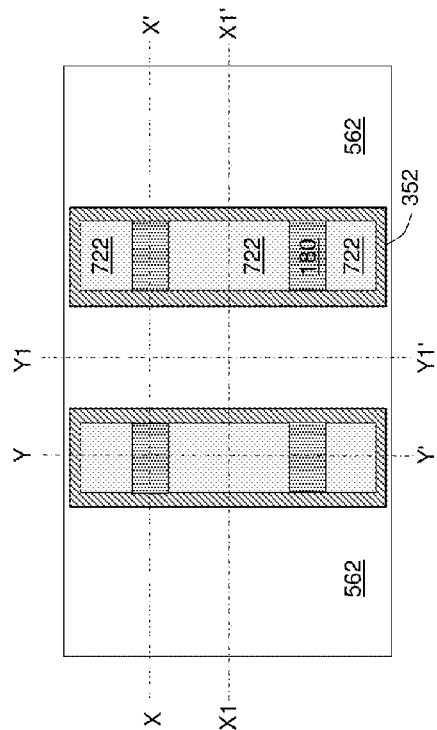
FIG. 7A
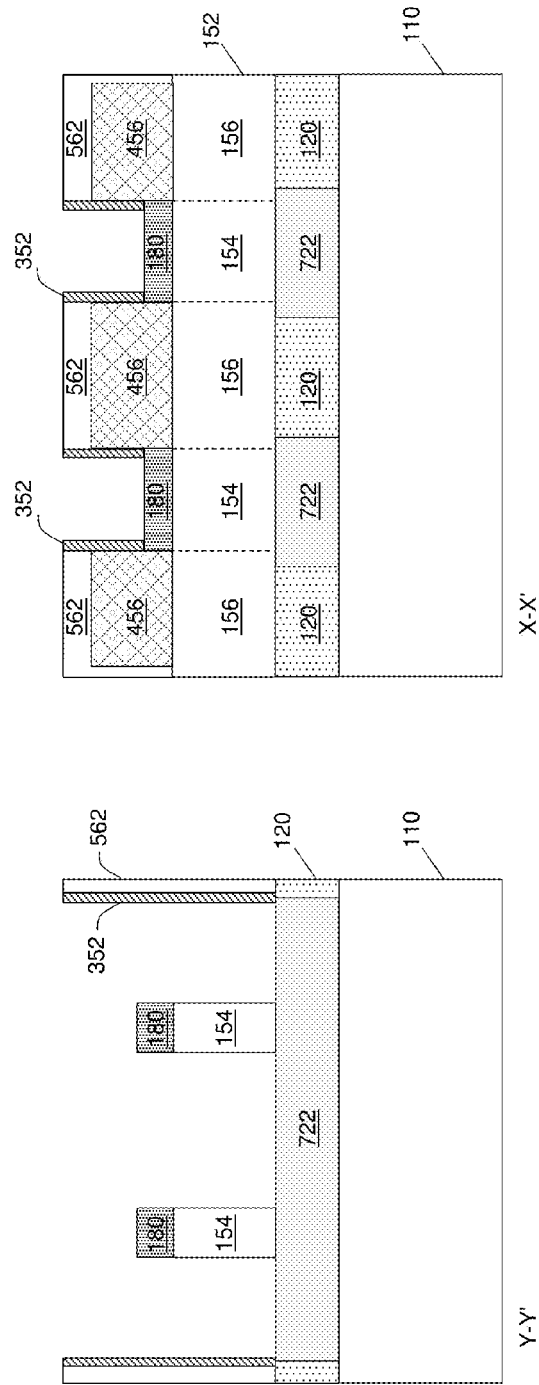
FIG. 7B
FIG. 7C

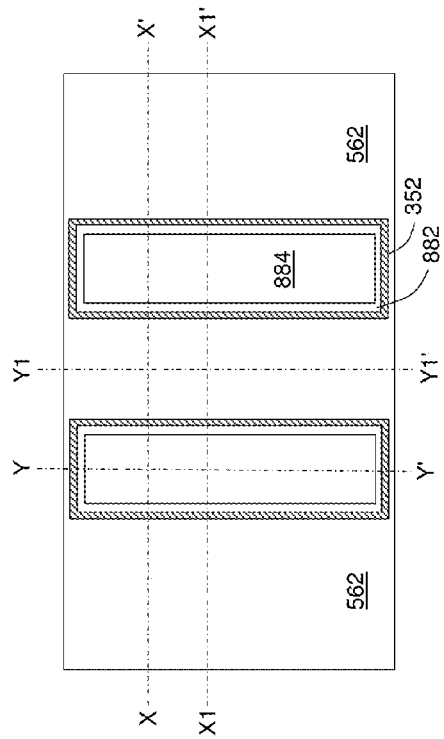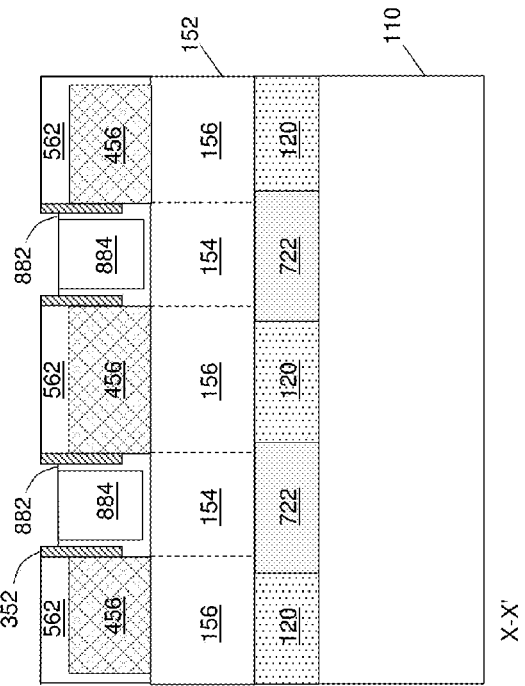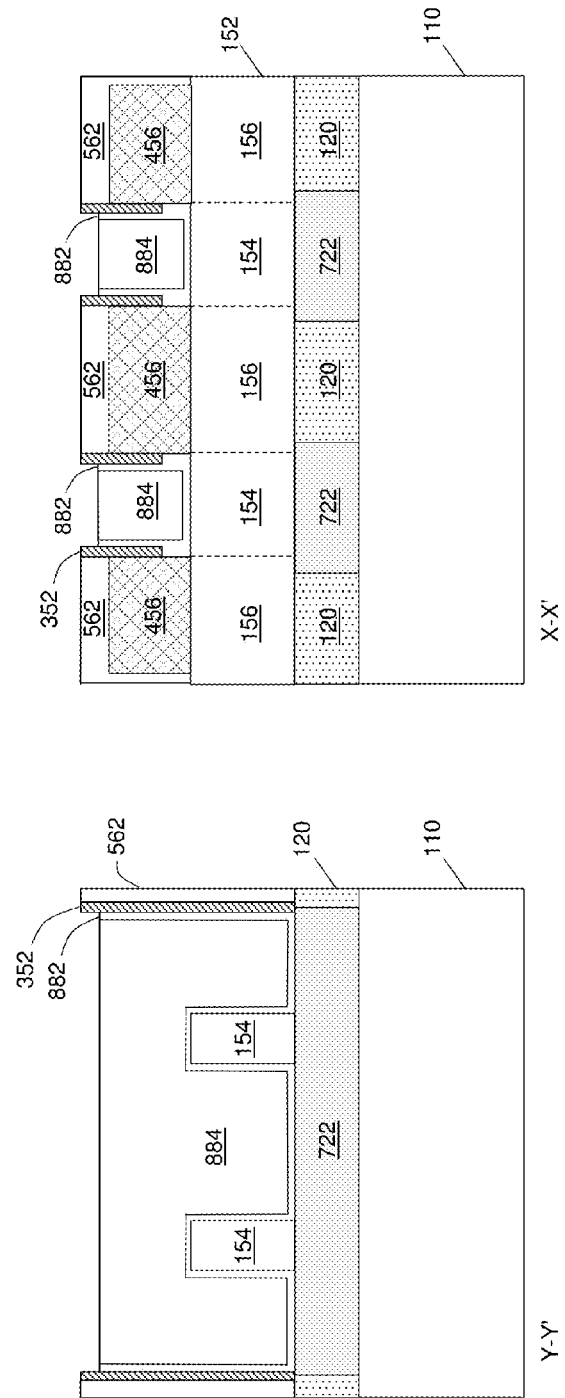

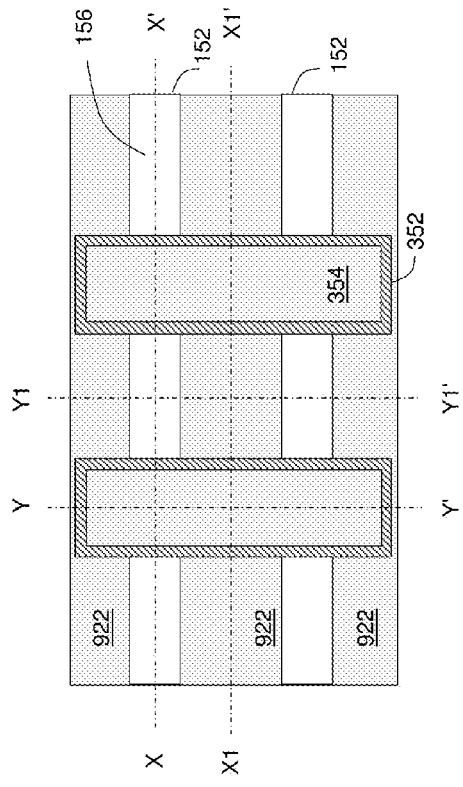
FIG. 9A
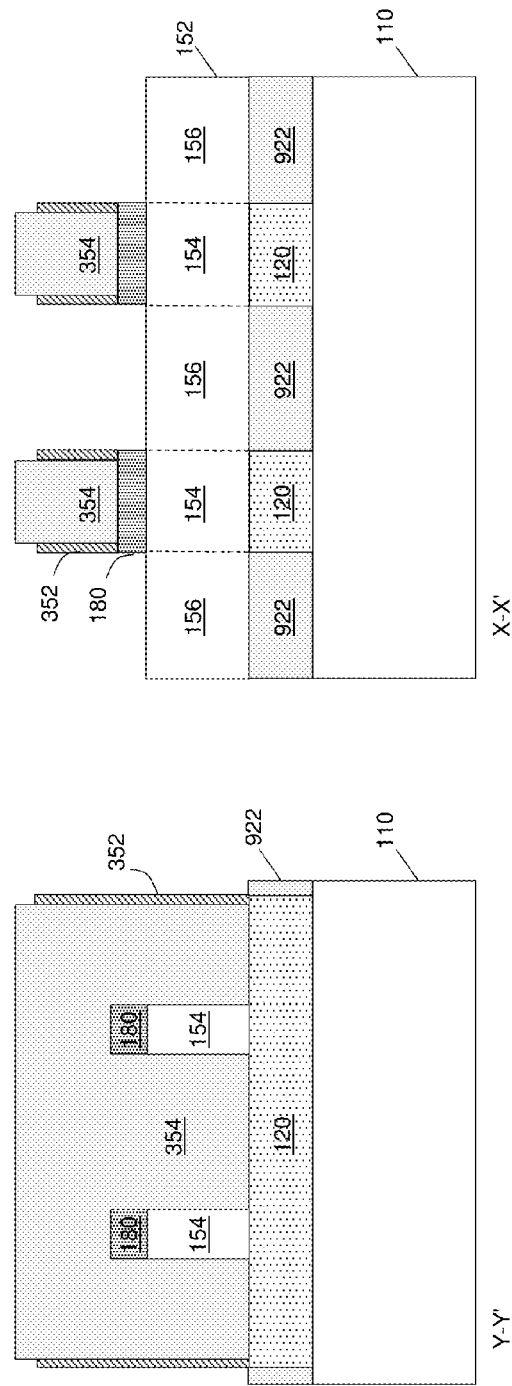
FIG. 9B
FIG. 9C

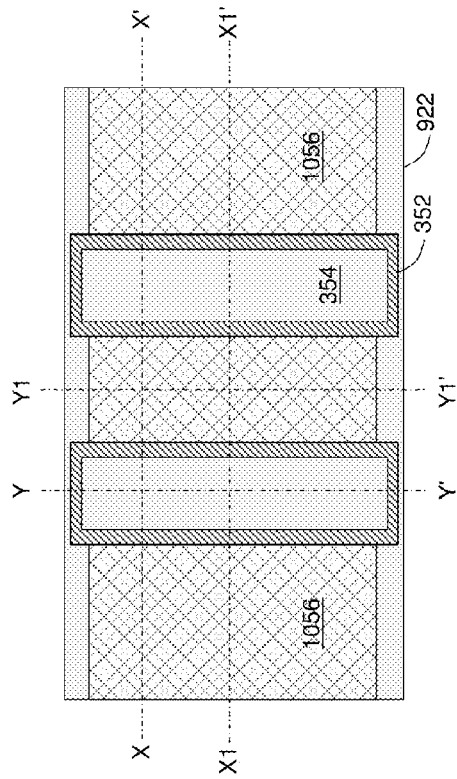
FIG. 10A
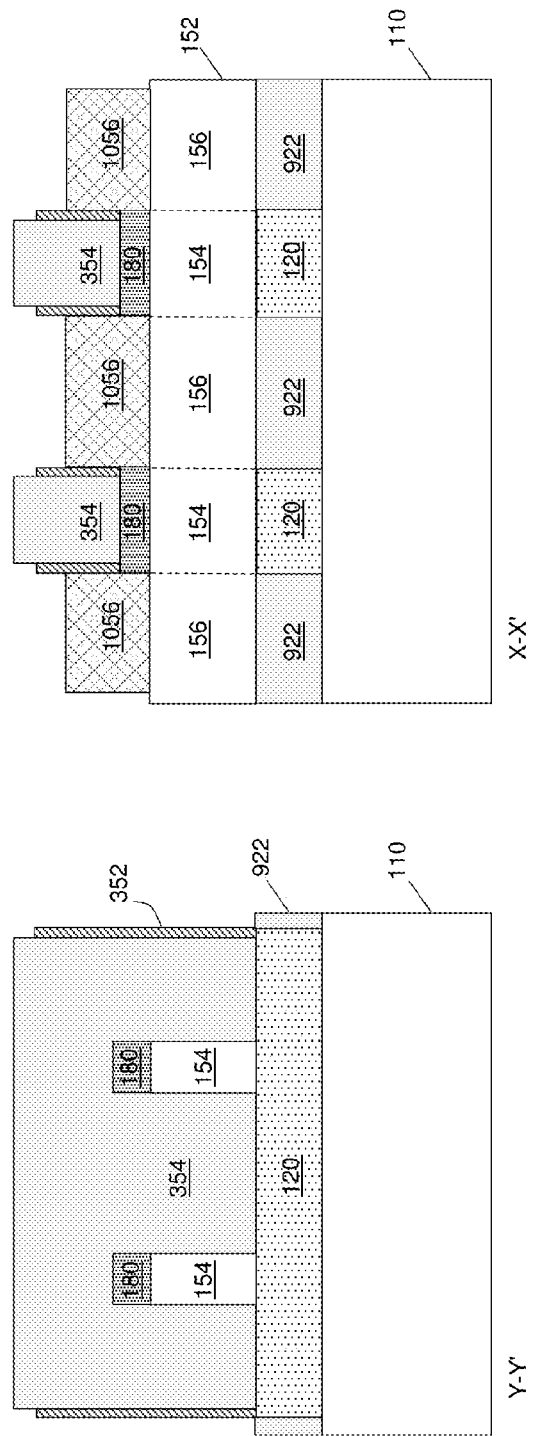
FIG. 10C
FIG. 10B

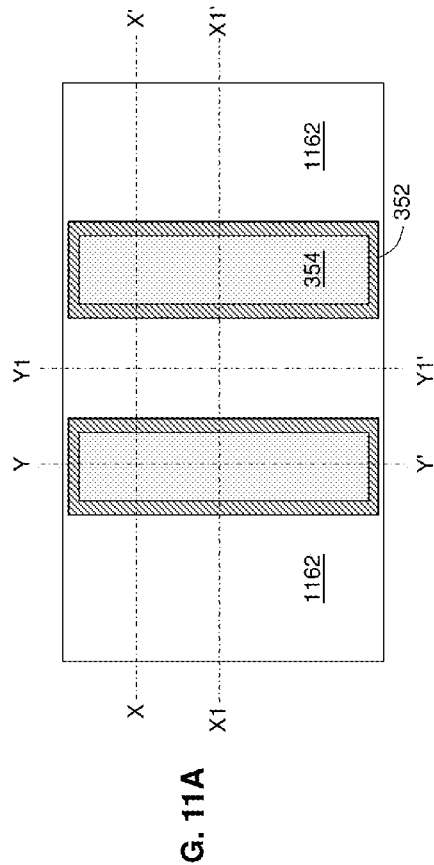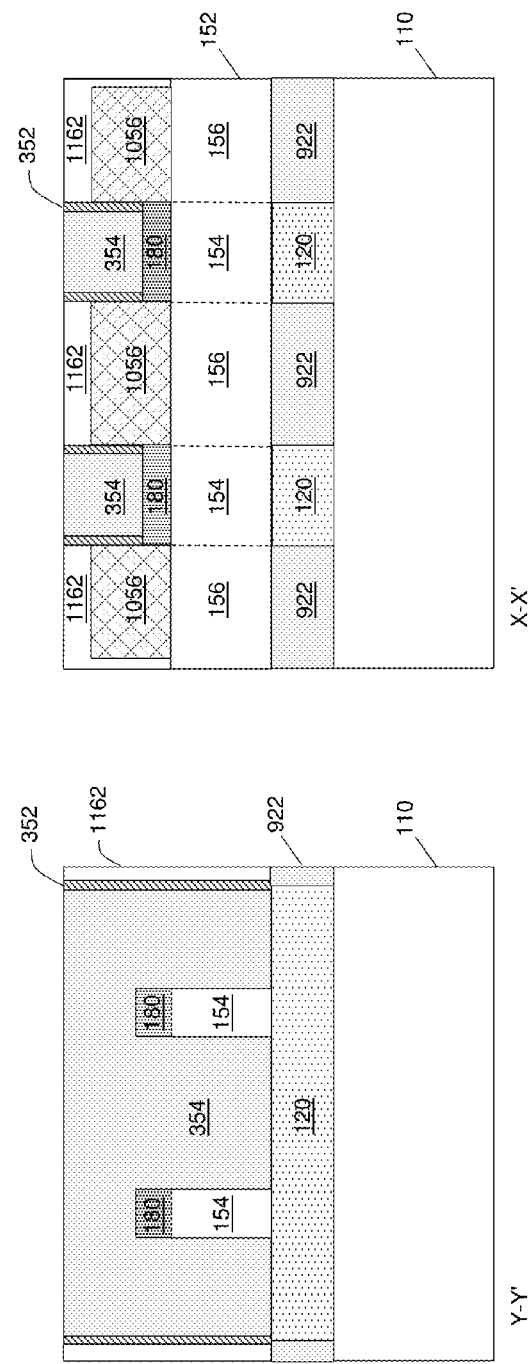
FIG. 11A
FIG. 11B
FIG. 11C

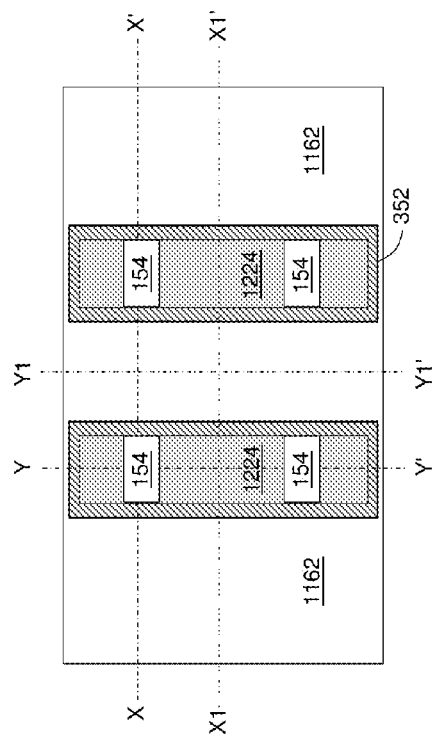
FIG. 12A
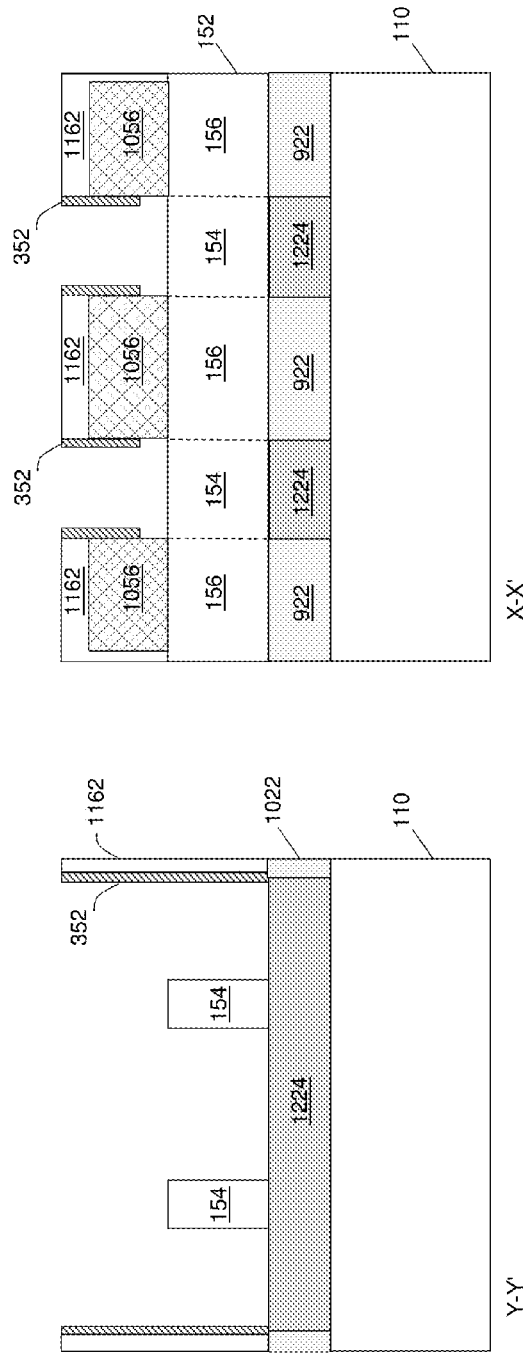
FIG. 12C
FIG. 12B

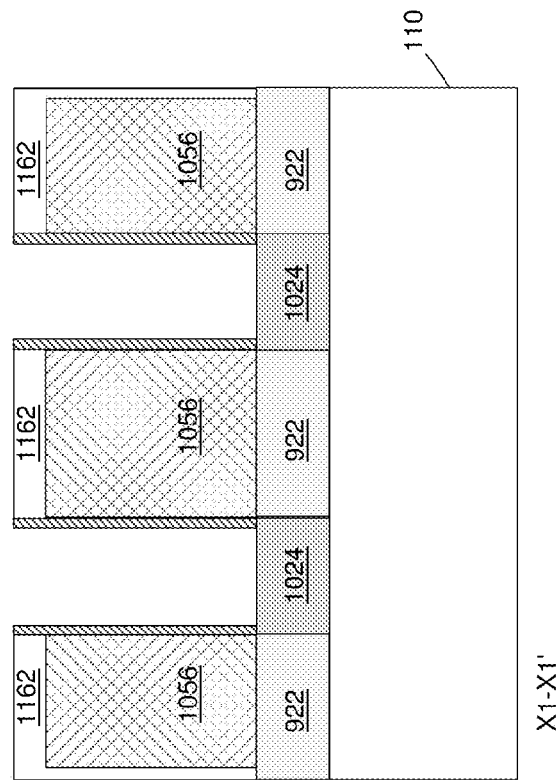
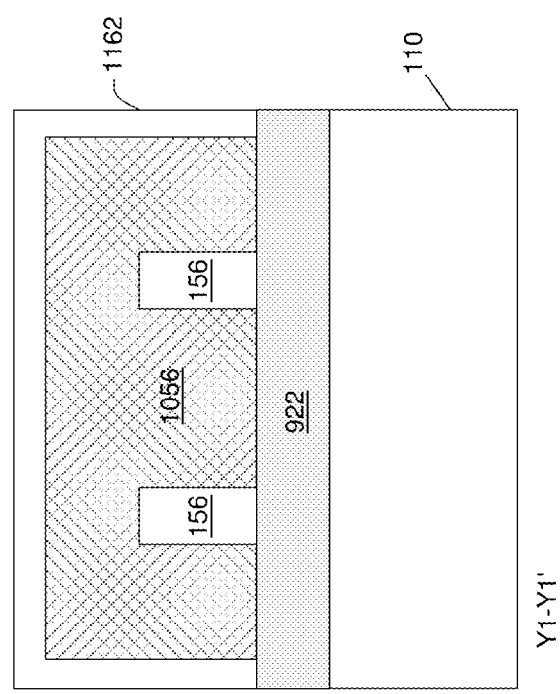

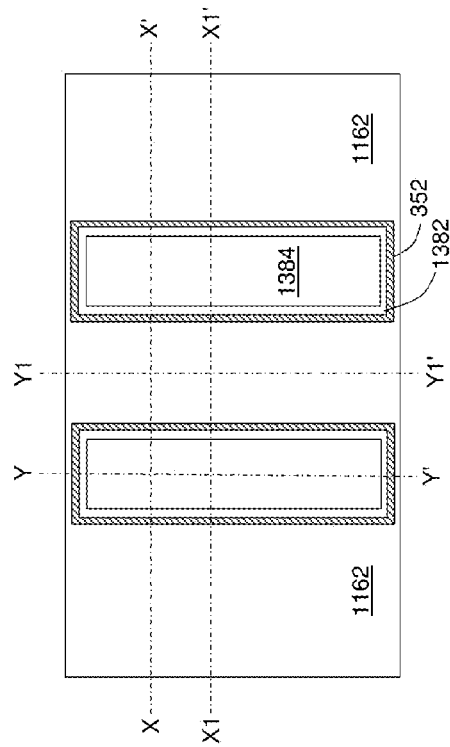
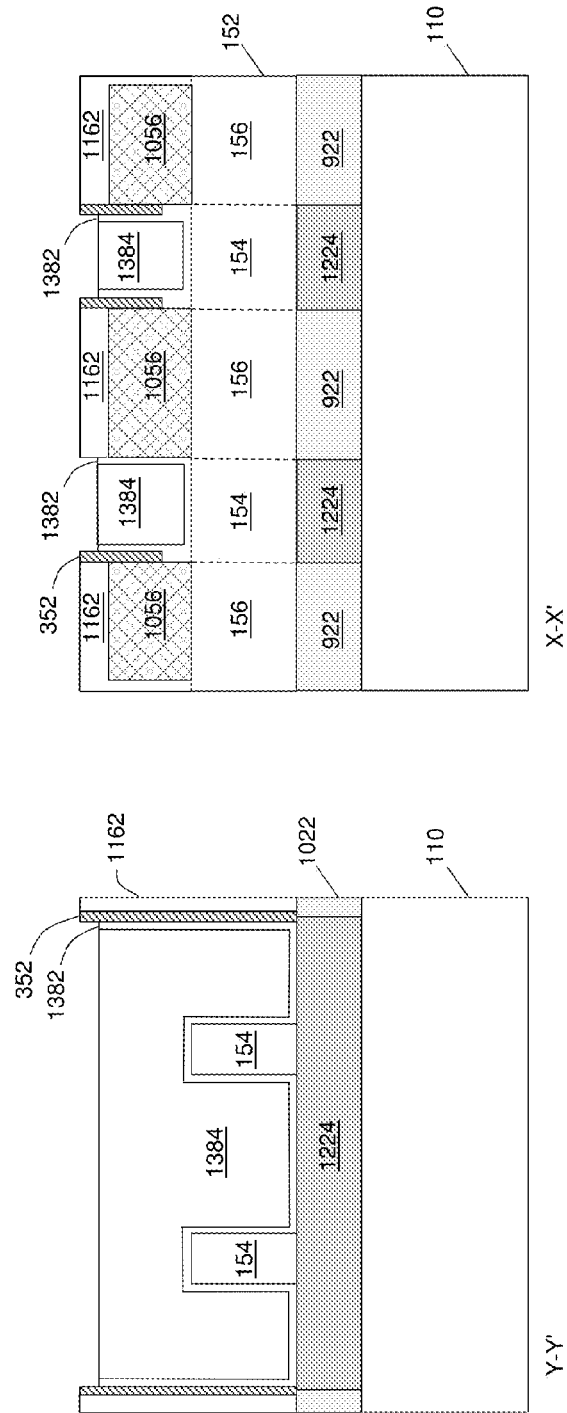
FIG. 13A
FIG. 13B
FIG. 13C

REPLACEMENT-GATE FINFET STRUCTURE AND PROCESS

BACKGROUND

1. Field of the Invention

Exemplary embodiments may generally relate to fin-type field effect transistors (FinFETs), used in small complementary metal oxide semiconductor (CMOS) integrated circuits. Particularly, exemplary embodiments of FinFETs may be formed on bulk silicon wafers, where junction isolation of source/drain (S/D) regions is provided. More particularly, self-aligned dielectric isolation of the body and extensions of the FinFET may be provided.

2. Description of the Related Art

Fin-type field effect transistor (FinFET) technology is the leading contender for 14 nm or smaller complementary metal oxide semiconductor (CMOS) integrated circuits. With FinFETs, the fin structure must be isolated from the substrate wafer by a dielectric to avoid large penalties in leakage, power, and variability. Silicon-on-insulator (SOI) substrates provide a simple solution, however SOI wafer cost and volume availability are detractors to this solution.

There remains a need for a structure and method of making a low-cost FinFET that uses bulk silicon wafers, provides junction isolation of the source/drain (S/D) regions, and provides self-aligned dielectric isolation of the body and extensions of the FinFET.

SUMMARY

An exemplary embodiment disclosed herein may provide a fin field effect transistor (FinFET) structure that is electrically isolated from the bulk substrate wafer. The FinFET structure may comprise a silicon fin further comprising a channel region and source/drain (S/D) regions formed on each end of said channel region. An entire bottom surface of the channel region may contact a top surface of a lower insulator, and bottom surfaces of the S/D regions may contact first portions of top surfaces of a lower silicon germanium (SiGe) layer. The FinFET structure may also comprise extrinsic S/D regions that contact a top surface and both side surfaces of each of the S/D regions and second portions of top surfaces of the lower SiGe layer. The FinFET structure may further comprise a gate stack that contacts a conformal dielectric, formed over a top surface and both side surfaces of the channel region, and that is disposed above the lower insulator and not above the first and second portions of the lower SiGe layer. The gate stack may be electrically insulated from the extrinsic S/D regions by the conformal dielectric.

Another exemplary embodiment disclosed herein may provide a method for manufacturing a fin field effect transistor (FinFET) that is electrically isolated from the bulk substrate wafer. The method may include forming a dummy gate over a portion of a silicon (Si) fin of the FinFET, where the fin is formed on a silicon germanium (SiGe) layer, which is formed on a Si substrate. The method may also include forming source/drain (S/D) regions on each side of the dummy gate in the Si fin, and depositing extrinsic S/D regions on the S/D regions of the Si fin and portions of the SiGe layer not covered by the dummy gate. The method may further include removing the dummy gate and exposing a channel region of the Si fin and portions of the SiGe layer proximate to the channel region. The method may yet further include selectively removing the SiGe layer from beneath the channel region, the exposed portions of the SiGe layer, and portions of the S/D regions adjacent to the channel region, and replacing the selectively removed SiGe layer with a second insulator. Finally, the method may include formation of a replacement gate by depositing a conformal dielectric on the channel region of the Si fin and the second insulator, and filling a space delimited by the conformal dielectric with a gate stack over the channel region of the Si fin.

Yet another exemplary embodiment disclosed herein may provide a fin field effect transistor (FinFET) structure that is electrically isolated from the bulk substrate wafer. The FinFET structure may include a silicon (Si) fin comprising a channel region and source/drain (S/D) regions formed on each end of the channel region. A bottom surface of the channel region may contact a top surface of a first lower insulator, and entire bottom surfaces of each of the S/D regions may contact top surfaces of second lower insulators. The FinFET structure may also include extrinsic S/D regions that contact a top surface and both side surfaces of each of the S/D regions and the top surfaces of the second lower insulators. The FinFET structure may further include a gate stack that contacts a conformal dielectric, formed over a top surface and both side surfaces of the channel region, and that is disposed above the first lower insulator and not said second lower insulator. The gate stack may be electrically insulated from the extrinsic S/D regions by the conformal dielectric.

Yet another exemplary embodiment disclosed herein may provide a method for manufacturing a fin field effect transistor (FinFET) that is electrically isolated from the bulk substrate wafer. The method may include forming a dummy gate over a portion of a silicon (Si) fin of the FinFET, where the Si fin is formed on a silicon germanium (SiGe) layer, which is formed on a Si substrate. The method may also include selectively removing the SiGe layer not covered by the dummy gate and by portions of the Si fin extending from each side of the dummy gate, and replacing the selectively removed SiGe layer with a first insulator. The method may further include forming S/D regions one each side of the dummy gate in the Si fin, and depositing extrinsic S/D regions on the S/D regions of the Si fin and on portions of the first insulator not covered by the dummy gate. The method may yet further include removing the dummy gate and exposing a channel region of the Si fin and portions of the SiGe layer proximate to the channel region, selectively removing the SiGe layer from beneath the channel region and the portions of the SiGe layer proximate to the channel region, and replacing the selectively removed SiGe layer with a second insulator. Finally, the method may include formation of a replacement gate by depositing a conformal dielectric on the channel region of the Si fin and the second insulator, and filling a space delimited by the conformal dielectric with a gate stack over the channel region of the Si fin.

BRIEF DESCRIPTION OF THE SEVERAL VIEWS OF THE DRAWINGS

The embodiments herein will be better understood from the following detailed description with reference to the drawings, which are not necessarily drawing to scale and in which:

FIG. 2A is a plan view illustrating fins formed on a silicon germanium (SiGe) layer of the substrate in an exemplary embodiment;

FIG. 2B is a cross section of the Y-Y' axis of FIG. 2A illustrating the fins formed on the SiGe layer of the substrate in an exemplary embodiment;

FIG. 2C is a cross section of the X-X' axis of FIG. 2A illustrating a fin formed on the SiGe layer of the substrate in an exemplary embodiment;

FIG. 3A is a plan view illustrating dummy gates formed on the fins in an exemplary embodiment;

FIG. 3B is a cross section of the Y-Y' axis of FIG. 3A illustrating the dummy gates formed on the fins in an exemplary embodiment;

FIG. 3C is a cross section of the X-X' axis of FIG. 3A illustrating the dummy gates formed on the fins in an exemplary embodiment;

FIG. 4A is a plan view illustrating extrinsic source/drain (S/D) regions formed over S/D regions of the fins in an exemplary embodiment;

FIG. 4B is a cross section of the Y-Y' axis of FIG. 4A illustrating extrinsic source/drain (S/D) regions formed over S/D regions of the fins in an exemplary embodiment;

FIG. 4C is a cross section of the X-X' axis of FIG. 4A illustrating extrinsic source/drain (S/D) regions formed over S/D regions of the fins in an exemplary embodiment;

FIG. 5D is a cross section of the Y1-Y1' axis of FIG. 5A illustrating the planarized first insulating layer deposited over the dummy gates and the extrinsic S/D regions in an exemplary embodiment;

FIG. 5E is a cross section of the X1-X1' axis of FIG. 5A illustrating the planarized first insulating layer deposited over the dummy gates and the extrinsic S/D regions in an exemplary embodiment;

FIG. 6A is a plan view illustrating removal of the dummy gates in an exemplary embodiment;

FIG. 6B is a cross section of the Y-Y' axis of FIG. 6A illustrating removal of the dummy gates in an exemplary embodiment;

FIG. 6C is a cross section of the X-X' axis of FIG. 6A illustrating removal of the dummy gates in an exemplary embodiment;

FIG. 7A is a plan view illustrating selectively removing the exposed SiGe and replacing the removed SiGe with a second insulator in an exemplary embodiment;

FIG. 7B is a cross section of the Y-Y' axis of FIG. 7A illustrating selectively removing the exposed SiGe and replacing the removed SiGe with the second insulator in an exemplary embodiment;

FIG. 7C is a cross section of the X-X' axis of FIG. 7A illustrating selectively removing the exposed SiGe and replacing the removed SiGe with the second insulator in an exemplary embodiment;

FIG. 8A is a plan view illustrating deposition of a conformal dielectric and a gate stack to form a fin field effect transistor (FinFET) in an exemplary embodiment;

FIG. 8B is a cross section of the Y-Y' axis of FIG. 8A illustrating deposition of the conformal dielectric and the gate stack to form the fin field effect transistor (FinFET) in an exemplary embodiment;

FIG. 8C is a cross section of the X-X' axis of FIG. 8A illustrating deposition of the conformal dielectric and the gate stack to form the fin field effect transistor (FinFET) in an exemplary embodiment;

FIG. 9A is a plan view illustrating selectively removing exposed SiGe from the structure shown in FIG. 3A, and replacing the removed SiGe with a first insulator in another exemplary embodiment;

FIG. 9B is a cross section of the Y-Y' axis of FIG. 9A illustrating selectively removing exposed SiGe from the structure shown in FIG. 3B, and replacing the removed SiGe with a first insulator in the another exemplary embodiment;

FIG. 9C is a cross section of the X-X' axis of FIG. 9A illustrating selectively removing exposed SiGe from the structure shown in FIG. 3C, and replacing the removed SiGe with a first insulator in the another exemplary embodiment;

FIG. 10A is a plan view illustrating extrinsic source/drain (S/D) regions formed over S/D regions of the fins in the another exemplary embodiment;

FIG. 10B is a cross section of the Y-Y' axis of FIG. 10A illustrating extrinsic source/drain (S/D) regions formed over S/D regions of the fins in the another exemplary embodiment;

FIG. 10C is a cross section of the X-X' axis of FIG. 10A illustrating extrinsic source/drain (S/D) regions formed over S/D regions of the fins in the another exemplary embodiment;

FIG. 11A is a plan view illustrating a planarized second insulating layer deposited over the dummy gates and the extrinsic S/D regions in the another exemplary embodiment;

FIG. 11B is a cross section of the Y-Y' axis of FIG. 11A illustrating the planarized second insulating layer deposited over the dummy gates and the extrinsic S/D regions in the another exemplary embodiment;

FIG. 11C is a cross section of the X-X' axis of FIG. 11A illustrating the planarized second insulating layer deposited over the dummy gates and the extrinsic S/D regions in the another exemplary embodiment;

FIG. 12A is a plan view illustrating removal of the dummy gates, selective removal of the exposed SiGe, and dummy of the removed SiGe with a third insulator in the another exemplary embodiment;

FIG. 12B is a cross section of the Y-Y' axis of FIG. 12A illustrating removal of the dummy gates, selective removal of the exposed SiGe, and dummy of the removed SiGe with the third insulator in the another exemplary embodiment;

FIG. 12C is a cross section of the X-X' axis of FIG. 12A illustrating removal of the dummy gates, selective removal of the exposed SiGe, and dummy of the removed SiGe with the third insulator in the another exemplary embodiment;

FIG. 12D is a cross section of the Y1-Y1' axis of FIG. 12A illustrating removal of the dummy gates, selective removal of the exposed SiGe, and dummy of the removed SiGe with the third insulator in the another exemplary embodiment;

FIG. 12E is a cross section of the X1-X1' axis of FIG. 12A illustrating removal of the dummy gates, selective removal of the exposed SiGe, and dummy of the removed SiGe with the third insulator in the another exemplary embodiment;

FIG. 13A is a plan view illustrating deposition of a conformal dielectric and a gate stack to form a fin field effect transistor (FinFET) in the another exemplary embodiment;

FIG. 13B is a cross section of the Y-Y' axis of FIG. 13A illustrating deposition of the conformal dielectric and the gate stack to form the FinFET in the another exemplary embodiment;

FIG. 13C is a cross section of the X-X' axis of FIG. 13A illustrating deposition of the conformal dielectric and the gate stack to form the FinFET in the another exemplary embodiment;

DETAILED DESCRIPTION

The descriptions of the various embodiments of the embodiments herein have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein. The method as described above is used in the fabrication of integrated circuit chips.

As stated above, there remains a need for a structure and method of making a low-cost fin field effect transistor (FinFET) that uses bulk silicon wafers, provides junction isolation of source/drain (S/D) regions, and provides self-aligned dielectric isolation of the body and extensions of the FinFET.

Figure 1:
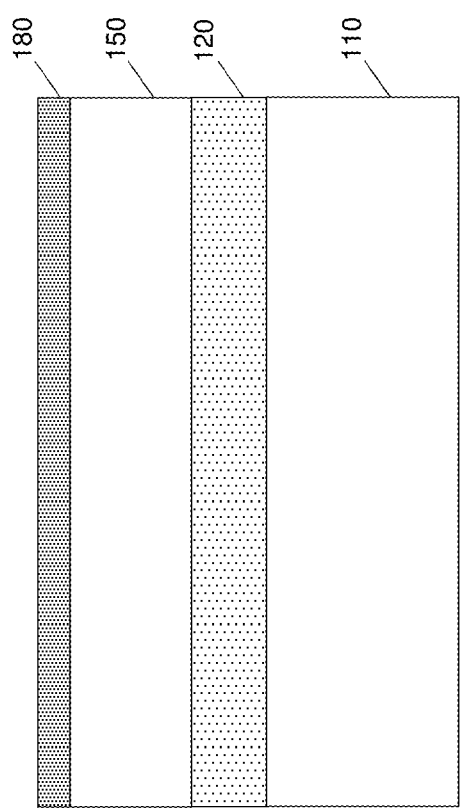
FIG. 1 is a cross section illustrating an initial substrate comprising four layers in an exemplary embodiment.

Referring to FIG. 1, a substrate comprising four layers may initially be formed in an exemplary embodiment. A SiGe layer 120 may be epitaxially grown on a crystalline Si substrate 110. The SiGe layer 120 may comprise molar fractions determined by $Si_{1-x}Ge_x$, where x is greater than 0.07 and less than 0.4. A Si layer 150 may be epitaxially grown on the SiGe layer 120 and a dielectric cap 180 may be formed on the Si layer 150. The dielectric cap 180 may comprise a composite layer with $SiO_2$ above and $Si_3N_4$ below.

Referring to FIGS. 2A-C, the dielectric cap 180 and the Si layer 150 may be etched to at least the SiGe layer 120 to form a longitudinal pattern of fins 152 for fin field effect transistors (FinFETs) disposed on portions of the SiGe layer 120 in an exemplary embodiment. FIG. 2 B illustrates a transverse cross section of the fins 152 along the Y-Y' axis shown in FIG. 2A, while FIG. 2C illustrates a longitudinal cross section of a fin 152 along the X-X' axis shown in FIG. 2A.

Referring to FIGS. 3A-C, rectangular areas comprising dummy gates 354 may be transversely formed over portions of the fins 152 and portions of the SiGe layer 120 in an exemplary embodiment. An etch stop 353 may be formed over portions of the dielectric cap 180 covering portions of the fins 152, corresponding to channel regions 154 of the Fin-FETS, and portions of the SiGe layer 120 to form rectangular areas, using patterning techniques well known in the art. Dummy gates 354 may fill the rectangular areas formed by the patterning to cover the etch stop 353. A level for the fill of the dummy gates 354 may exceed that of the etch stop 353 covering the dielectric cap 180 over the channel regions 154 of the fins 152. After formation of the dummy gates 354, any patterned structures may be removed and sidewalls 352 may be formed on sides of the dummy gates 354. The height of the sidewalls 352 may be greater than that of the etch stop 353 covering the dielectric cap 180 over the channel regions 154 of the fins 152, but less than that of a top surface of the dummy gates 354.

Following formation of the dummy gates 354, portions of the dielectric cap 180, not covered by the dummy gates 354, may be removed to expose portions of the fins 152. Source/drain (S/D) regions 156 may then be formed by ion implantation to each side of the dummy gates 354 in the exposed portions of the fins 152, using the dummy gates 354 as masks. For example, p-type FinFETs may be implanted with positive boron (B) ions, while n-type FinFETs may be implanted with negative arsenic (As) or phosphorus (P) ions.

Figure 4E:
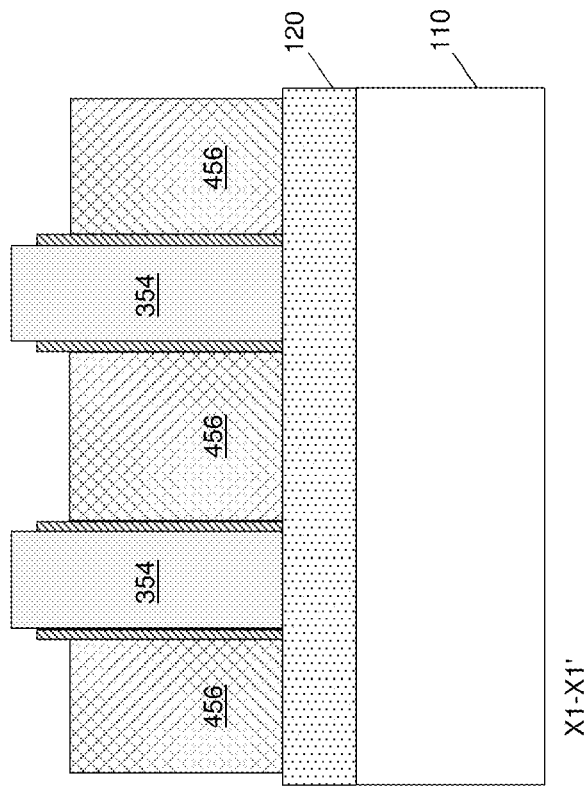
FIG. 4E is a cross section of the X1-X1' axis of FIG. 4A illustrating extrinsic source/drain (S/D) regions formed over S/D regions of the fins in an exemplary embodiment.

Referring to FIGS. 4A-E, a silicon-containing layer may be deposited over the S/D regions 156 of the fins 152 and exposed portions of the SiGe layer 120, not covered by the dummy gates 354, to form extrinsic S/D regions 456 in an exemplary embodiment. FIGS. 4A and 4C show that the extrinsic S/D regions 456 are disposed to either side of the dummy gates 354. FIG. 4C also shows that a length of a top surface of a S/D region 152, which is not covered by a gate structure 354, may be in contact with an extrinsic S/D region

Figure 4D:
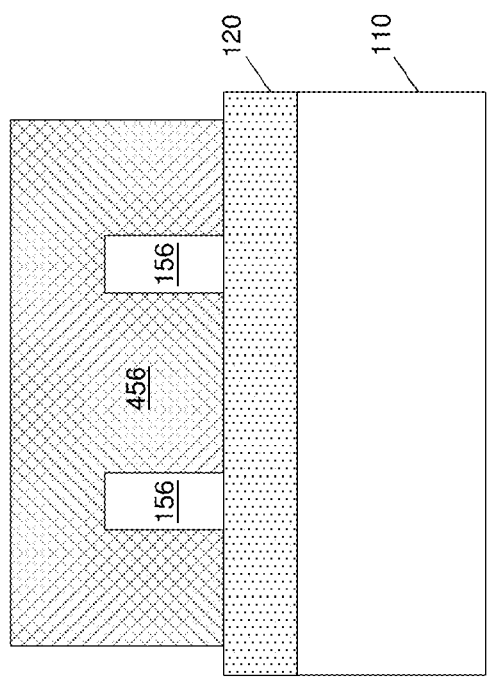
FIG. 4D is a cross section of the Y1-Y1' axis of FIG. 4A illustrating extrinsic source/drain (S/D) regions formed over S/D regions of the fins in an exemplary embodiment.
Figure 5A:
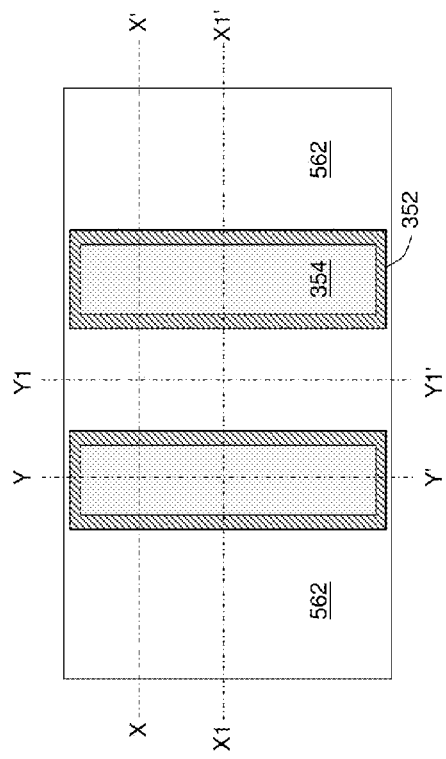
FIG. 5A is a plan view illustrating a planarized first insulating layer deposited over the dummy gates and the extrinsic S/D regions in an exemplary embodiment.
Figure 5C:
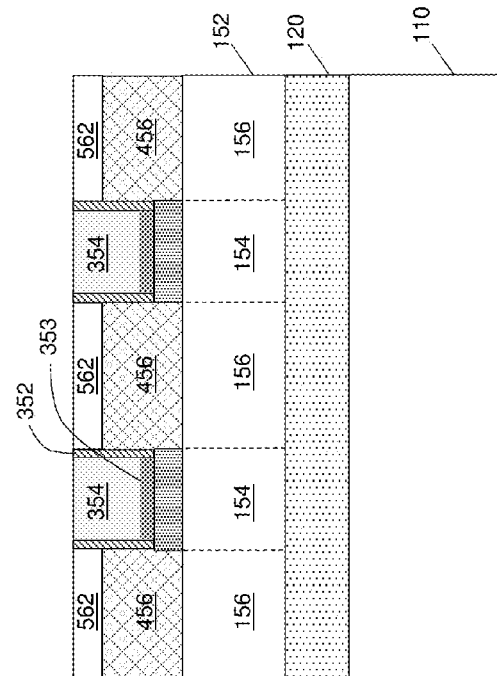
FIG. 5C is a cross section of the X-X' axis of FIG. 5A illustrating the planarized first insulating layer deposited over the dummy gates and the extrinsic S/D regions in an exemplary embodiment.
Figure 5B:
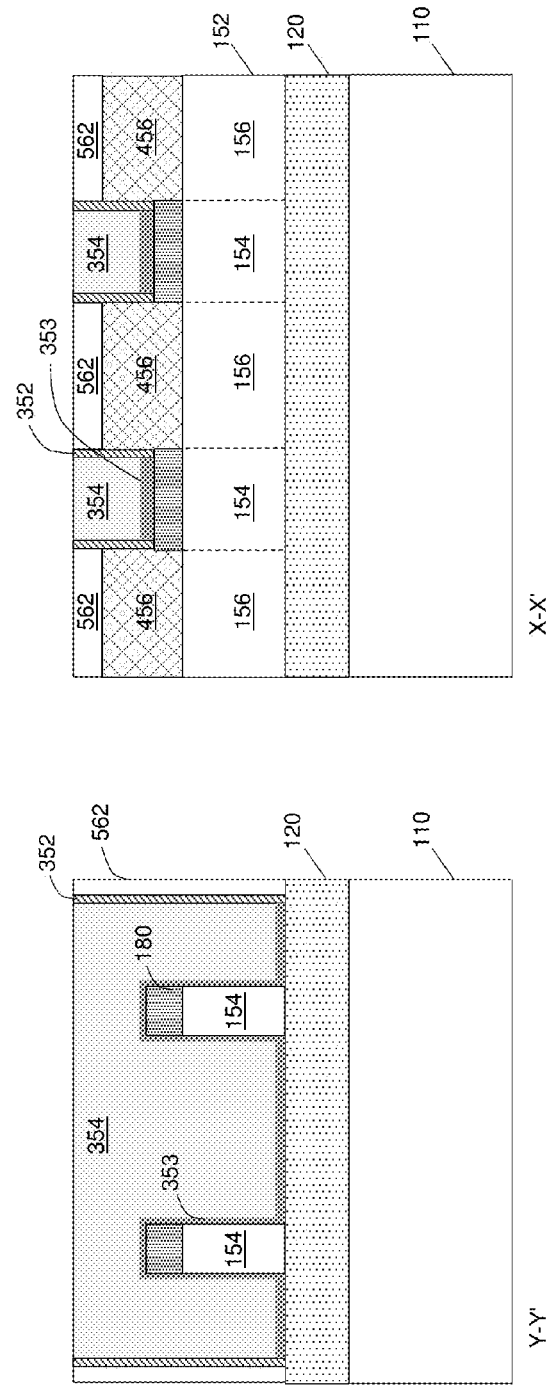
FIG. 5B is a cross section of the Y-Y' axis of FIG. 5A illustrating the planarized first insulating layer deposited over the dummy gates and the extrinsic S/D regions in an exemplary embodiment.

456. While FIG. 4D, shows that an S/D region 156 may contact an extrinsic S/D region 456 on both its side surfaces and its top surface.

In various exemplary embodiments, the extrinsic S/D regions 456 may comprise any of doped Si, doped SiGe, doped SiC, and $PtSi_2$, or other silicides, in one or more layers. For example, a concentration of p-type dopant in a doped Si extrinsic S/D region 456 may be less than that of the p-type dopant in the underlying S/D region 156 of a p-type FinFET. Similarly, a concentration of n-type dopant in a doped Si extrinsic S/D region 456 may be less than that of the n-type dopant in the underlying S/D region 156 of a n-type FinFET. A boron (B) doped SiGe extrinsic S/D region 456 may be formed on an underlying p-type S/D region 156 of a p-type FinFET, while a phosphorus (P)-doped SiC extrinsic S/D region 456 may be formed on an underlying n-type S/D region 156 of a n-type FinFET in various exemplary embodiments. A $PtSi_2$ extrinsic S/D region 456 may, for example, facilitate silicidation of the FinFET. A silicon (Si) extrinsic S/D region 456 may provide a contact strap from the underlying S/D region 156 to other structures in an integrated circuit including FinFETS of the exemplary embodiments.

Figure 6E:
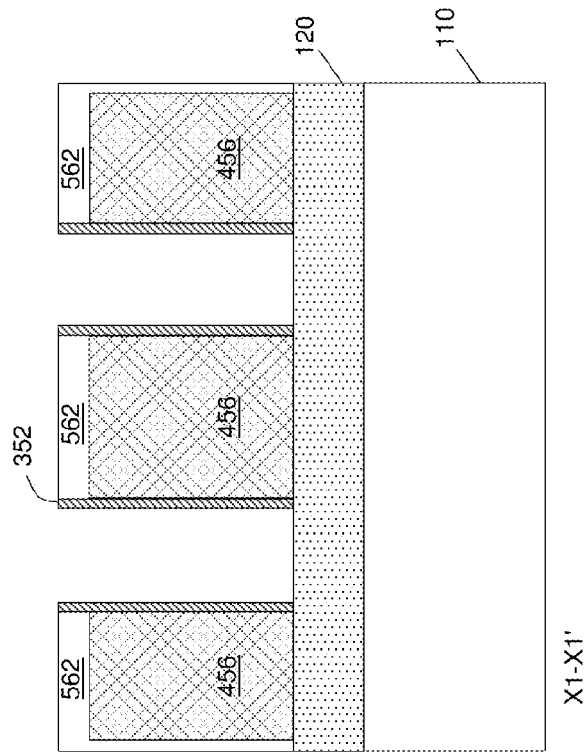
FIG. 6E is a cross section of the X1-X1' axis of FIG. 6A illustrating removal of the dummy gates in an exemplary embodiment.
Figure 6D:
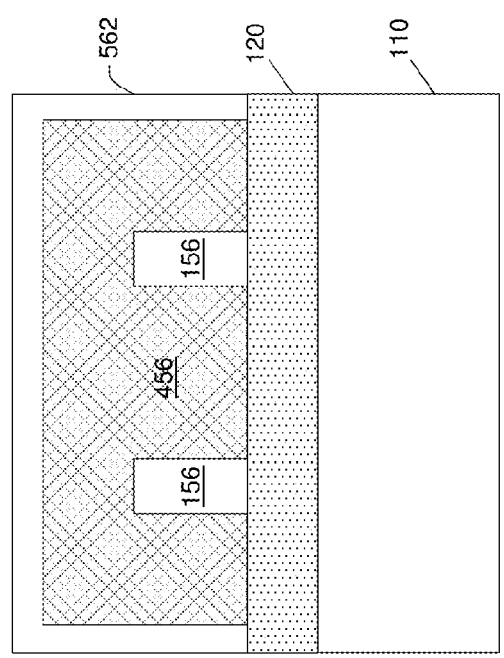
FIG. 6D is a cross section of the Y1-Y1' axis of FIG. 6A illustrating removal of the dummy gates in an exemplary embodiment.

Referring to FIGS. 5A-E, a first insulating layer 562 may be deposited over the extrinsic S/D regions 456 and the dummy gates 354, and then planarized in an exemplary embodiment. Planarization of the deposited first insulating layer 562 may expose top surfaces of the dummy gates 354 and the sidewalls 352. Thus, the planarized top surfaces of the first insulating layer 562, the dummy gates 354, and the sidewalls 352 may be substantially co-planar in an exemplary embodiment. The first insulating layer 562 may comprise, for example, any of $SiO_2$ and $Si_3N_4$ Referring to FIG. 6A-E, the dummy gates 354 and the underlying etch stop 353 may be removed to expose the dielectric caps 180, covering the channel regions 154 of the fins 152, and portions of the SiGe layer 120, disposed transversely to each of the channel regions 154, in an exemplary embodiment. Thus, as shown in FIGS. 6A-C, the channel regions 154 of the fins 152 and their dielectric caps 180 may be exposed and may be seen to be disposed on the underlying SiGe layer 120. While, as shown in FIG. 6D, the S/D regions 156 of the fins 152 may remain covered by the extrinsic S/D regions 456 and the first insulating layer 562.

Figure 7E:
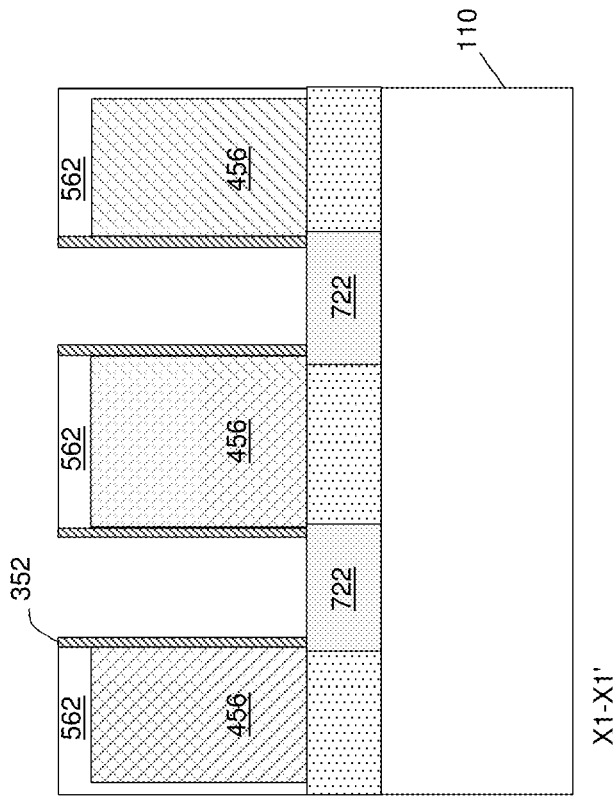
FIG. 7E is a cross section of the X1-X1' axis of FIG. 7A illustrating selectively removing the exposed SiGe and replacing the removed SiGe with the second insulator in an exemplary embodiment.
Figure 7D:
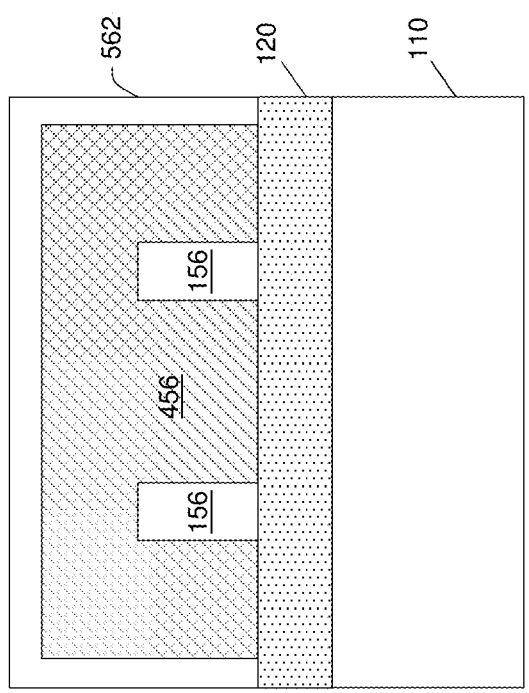
FIG. 7D is a cross section of the Y1-Y1' axis of FIG. 7A illustrating selectively removing the exposed SiGe and replacing the removed SiGe with the second insulator in an exemplary embodiment.

Referring to FIGS. 7A-C, the exposed SiGe layer 120 may be selectively removed, along with portions of the SiGe layer 120 that may underlie the channel regions 154 of the fins 152 and portions of the SiGe layer 120 adjacent to ends of the channel regions 154 that may underlie portions of the S/D regions 156 of the fins in an exemplary embodiment. The selective etching by, for example, $SF_6$, may undercut and remove the SiGe layer 120 from beneath the fins 152, which are of narrow width, while the channel regions 154 of the fins 152 are supported at each end by the adjacent S/D regions 156 of the fins 152. Portions of the SiGe layer 120 underlying the adjacent S/D regions 156 of the fins 152 may also be selectively etched, as shown in FIG. 7C, of an exemplary embodiment. As shown in FIG. 7E, the selective etching may also remove the exposed SiGe layer 120 disposed transversely between the fins 152.

Referring to FIGS. 7A-C and 7E, a second insulator 722 may be deposited to replace the selectively removed SiGe layer 120, under the channel regions 154 of the fins 152 and under portions of the S/D regions 156 of the fins 152 that are adjacent to the channel regions 154 in an exemplary embodiment. As shown in FIG. 7C, deposition of the second insulator 722 may electrically isolate the channel regions 154 and junctions of the channel regions 154 and of the S/D regions 156 of the fins 152 from the underlying Si substrate 110. The second insulator 722 may comprise, for example, any of $SiO_2$ and $Si_3N_4$, or other dielectric materials.

Following deposition of the second insulator layer 722, the dielectric caps 180 that overlie the channel regions 154 of the fins 152 may be removed, to expose the underlying channel regions 154, i.e., gate regions, in an exemplary embodiment.

Figure 8E:
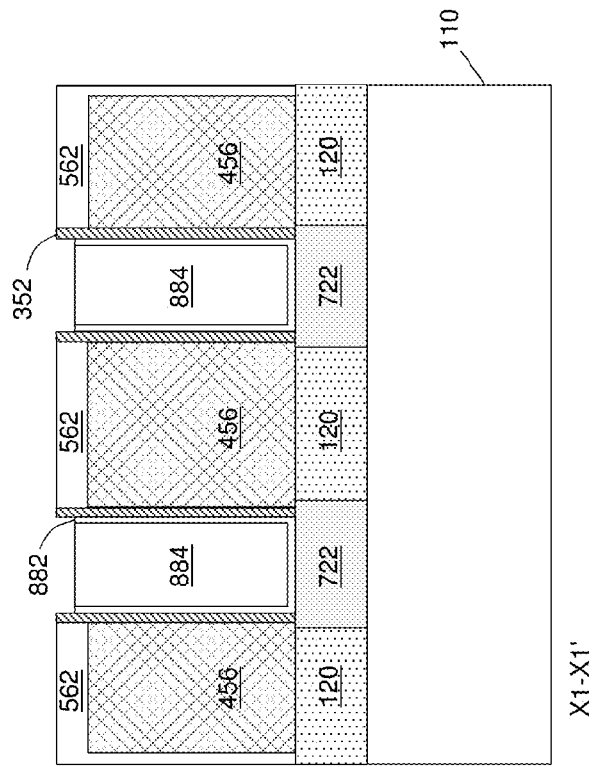
FIG. 8E is a cross section of the X1-X1' axis of FIG. 8A illustrating deposition of the conformal dielectric and the gate stack to form the fin field effect transistor (FinFET) in an exemplary embodiment.

Referring to FIGS. 8A-E, a conformal dielectric 882 may be deposited on the sidewalls 352, the second insulator 722, and the channel regions 154, i.e., gate regions, of the fins 152 in an exemplary embodiment. The conformal dielectric 882 may form gate dielectrics over the channel regions 154 of the fins 152. As shown in FIGS. 8B and 8C, gate stacks 884 may then be formed over the conformal dielectric 882. The gate stacks 884 may comprise one or more layers comprising, for example, silicon oxynitrides, hafnium silicates, or hafnium oxides, followed by electrical conductors, such as TiN.

Figure 8D:
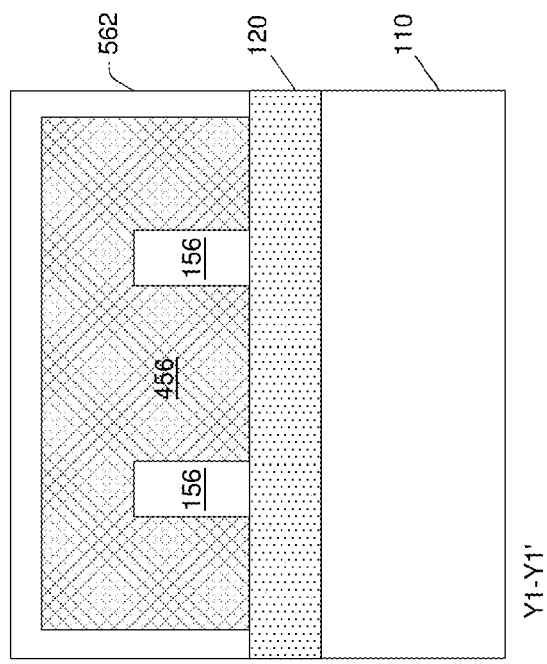
FIG. 8D is a cross section of the Y1-Y1' axis of FIG. 8A illustrating deposition of the conformal dielectric and the gate stack to form the fin field effect transistor (FinFET) in an exemplary embodiment.
Figure 9E:
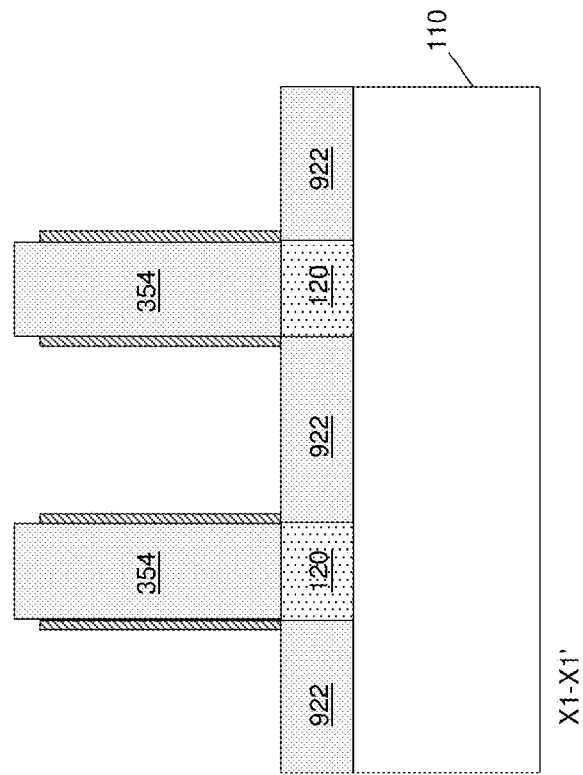
FIG. 9E is a cross section of the X1-X1' axis of FIG. 9A illustrating selectively removing exposed SiGe from the structure shown in FIG. 9A, and replacing the removed SiGe with a first insulator in the another exemplary embodiment.
Figure 9D:
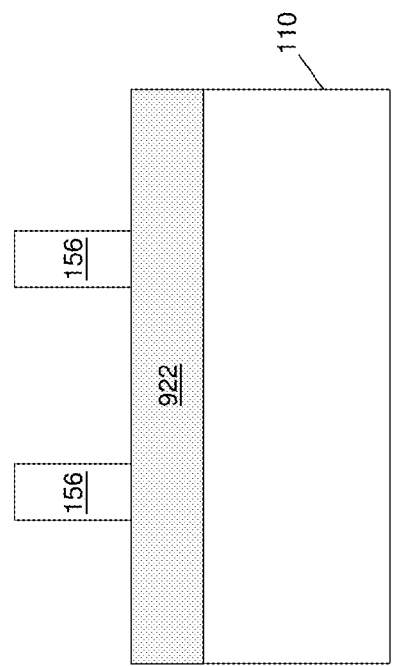
FIG. 9D is a cross section of the Y1-Y1' axis of FIG. 9A illustrating selectively removing exposed SiGe from the structure shown in FIG. 9A, and replacing the removed SiGe with a first insulator in the another exemplary embodiment.

From the method described above in FIGS. 1 through 8E, a FinFET structure may be manufactured in an exemplary embodiment. The FinFET structure may comprise a silicon fin 152, as shown in FIG. 8C. The silicon fin 152 may comprise a channel region 154 and source/drain (S/D) regions 156 formed on each end of the channel region 154, in which an entire bottom surface of the channel region 154 contacts a lower insulator 722 and a bottom surface of each of the S/D regions 156 contacts a portion of a lower SiGe layer 120, as shown in FIGS. 8B and 8C. The FinFET structure may also comprise extrinsic S/D regions 456 that contact a top surface and both side surfaces of each of the S/D regions 156 and portions of the lower SiGe layer 120, as shown in FIGS. 8C and 8D. The FinFET structure may further comprise a gate stack 884 that contacts a conformal dielectric 882, which is formed over a top surface and both side surfaces of the channel region 154, and that is disposed above the lower insulator 722 and not the portions of the lower SiGe layer 120, as shown in FIGS. 8A-C. The gate stacks 844 may be electrically insulated from the extrinsic S/D regions 456 by, for example, the sidewalls 352 and the conformal dielectric 882, as shown in FIGS. 8A-C.

The lower insulator 722 and the lower SiGe layer 120 may be formed on the crystalline Si substrate 110, and the top surface of each of the lower insulator 722 and the lower SiGe layer 120 may be co-planar. The top surface of the channel region 154 and top surfaces of each of the S/D regions 156 of the silicon fin 152 may be co-planar. Each end of the channel region 154 and each end of the S/D regions 156 formed on each end of the channel region 154 may form a junction, and each of the junctions may be disposed above and contact the lower insulator 722.

The extrinsic S/D regions 456 of the FinFET structure may comprise one or more Si-containing layers in an exemplary embodiment. A silicon-containing layer may comprise any of an n-type doped Si, an n-type doped SiGe, and an n-type doped SiC layer for an n-type FinFET, and any of a p-type doped Si, and a p-type doped SiGe layer for a p-type FinFET. The silicon-containing layer may comprise $PtSi_2$ for silicidation of either an n-type or a p-type FinFET. An upper insulating layer 562 may cover the extrinsic S/D regions 456, as shown in FIGS. 8A, 8C, 8D and 8E.

An alternative exemplary embodiment may also start with the structures shown in FIGS. 3A-C, and then selectively remove the underlying SiGe layer 120, not covered by the dummy gates 354 and by portions of the fins 152. The selective etching by, for example, $SF_6$, may undercut and remove the SiGe layer 120 from beneath the portions of the fins 152, which are of narrow width. Referring to FIGS. 9A-E, a first insulator 922 may be deposited to replace the selectively removed SiGe layer 120, including the SiGe layer 120 disposed beneath the portions of the fins 152 in an exemplary embodiment. Deposition of the first insulator 922 may electrically isolate the portions of the fins 152 from the underlying Si substrate 110. The first insulator 922 may comprise, for example, any of $SiO_2$ and $Si_3N_4$.

Following deposition of the first insulator 922, source/drain (S/D) regions 156 may be formed by ion implantation to each side of the dummy gates 354 in the exposed portions of the fins 152, using the dummy gates 354 as masks, as clearly shown in FIG. 9C. For example, p-type FinFETs may be implanted with positive boron (B) ions, while n-type FinFETs may be implanted with negative arsenic (As) or phosphorus (P) ions.

Figure 10E:
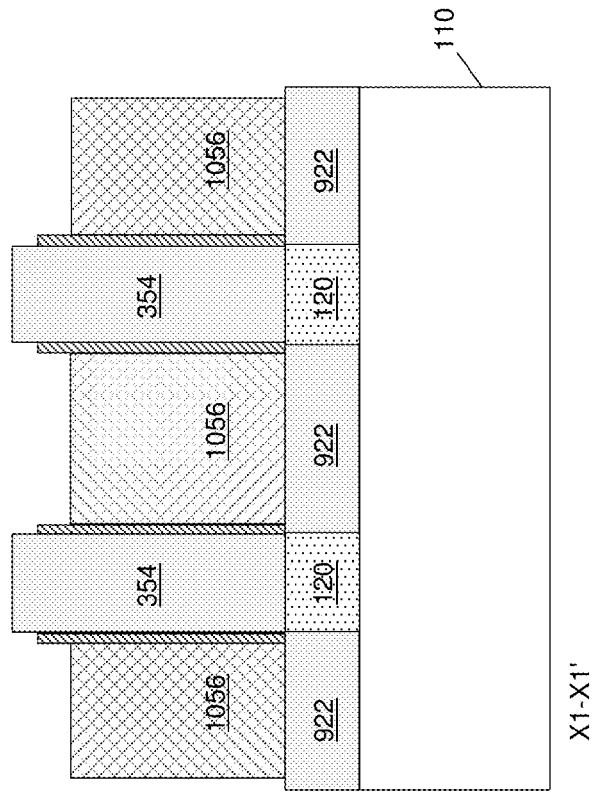
FIG. 10E is a cross section of the X1-X1' axis of FIG. 10A illustrating extrinsic source/drain (S/D) regions formed over S/D regions of the fins in the another exemplary embodiment.
Figure 10D:
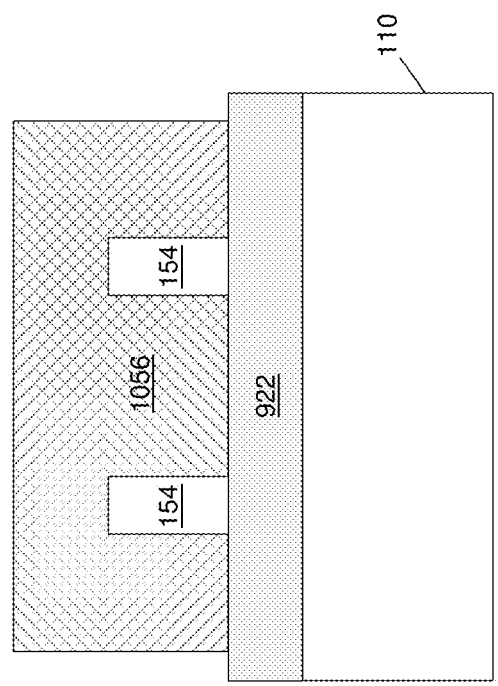
FIG. 10D is a cross section of the Y1-Y1' axis of FIG. 10A illustrating extrinsic source/drain (S/D) regions formed over S/D regions of the fins in the another exemplary embodiment.
Figure 11E:
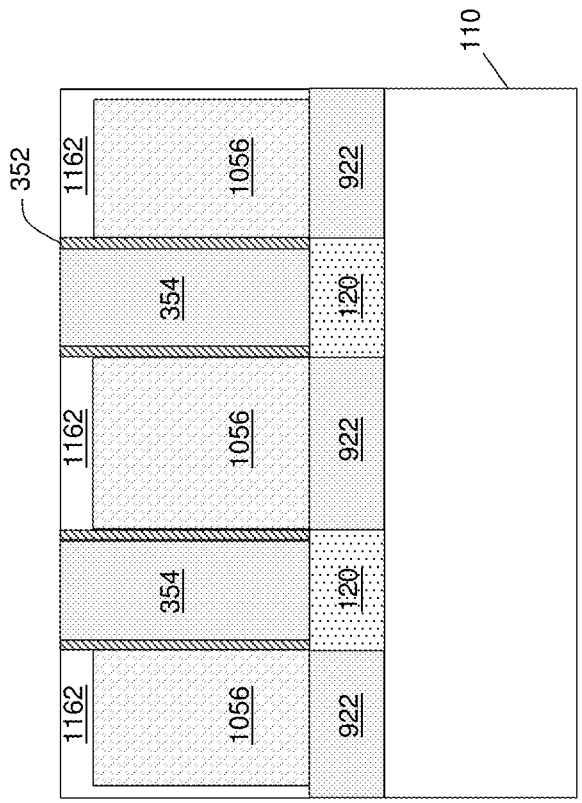
FIG. 11E is a cross section of the X1-X1' axis of FIG. 11A illustrating the planarized second insulating layer deposited over the dummy gates and the extrinsic S/D regions in the another exemplary embodiment.
Figure 11D:
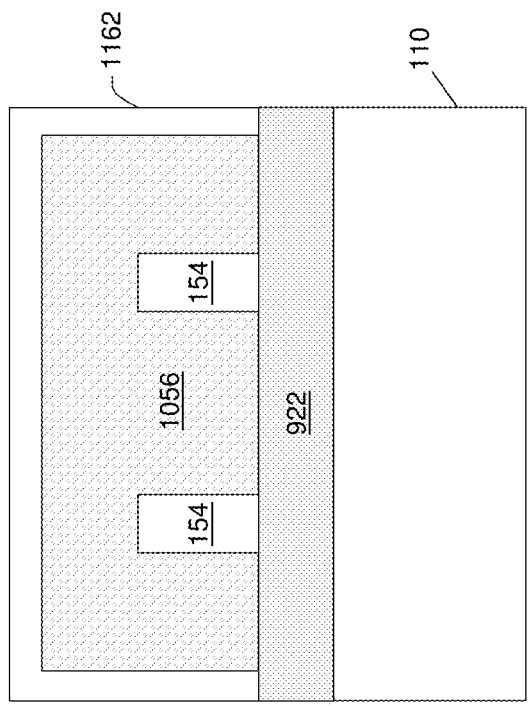
FIG. 11D is a cross section of the Y1-Y1' axis of FIG. 11A illustrating the planarized second insulating layer deposited over the dummy gates and the extrinsic S/D regions in the another exemplary embodiment.

Referring to FIGS. 10A-E, a silicon-containing layer may be deposited over the S/D regions 156 of the fins 152 and the first insulator 922, not covered by the dummy gates 354, to form extrinsic S/D regions 1056 in an exemplary embodiment. FIGS. 10A and 10C show that the extrinsic S/D regions 1056 are disposed to either side of the dummy gates 354. FIG. 10C also shows that a length of a top surface of a S/D region 156, which is not covered by a gate structure 354, may be in contact with an extrinsic S/D region 1056. While FIG. 10D, shows that an S/D region 156 may contact an extrinsic S/D region 1056 on both its side surfaces and its top surface.

In various exemplary embodiments, the extrinsic S/D regions 1056 may comprise any of doped Si, doped SiGe, doped SiC, and $PtSi_2$ in one or more layers. For example, a concentration of p-type dopant in a doped Si extrinsic S/D region 1056 may be less than that of the p-type dopant in the underlying S/D region 156 of a p-type FinFET. Similarly, a concentration of n-type dopant in a doped Si extrinsic S/D region 1056 may be less than that of the n-type dopant in the underlying S/D region 156 of a n-type FinFET. A boron (B) doped SiGe extrinsic S/D region 1056 may be formed on an underlying p-type S/D region 156 of a p-type FinFET, while a phosphorus (P)-doped SiC extrinsic S/D region 1056 may be formed on an underlying n-type S/D region 156 of a n-type FinFET in various exemplary embodiments. A $PtSi_2$ extrinsic S/D region 1056 may, for example, facilitate silicidation of the FinFET. A silicon (Si) extrinsic S/D region 1056 may provide a contact strap from the underlying S/D region 156 to other structures in an integrated circuit including FinFETS of the exemplary embodiments. Extrinsic S/D regions 1056 may provide an electrical path with low contact resistance from the above FinFET structure to the fin channel, thus providing high speed switching.

Referring to FIGS. 11A-E, a second insulating layer 1162 may be deposited over the extrinsic S/D regions 1056 and the dummy gates 354, and then planarized in an exemplary embodiment. Planarization of the deposited second insulating layer 1162 may expose top surfaces of the dummy gates 354 and the sidewalls 352. Thus, the planarized top surfaces of the second insulating layer 1162, the dummy gates 354, and the sidewalls 352 may be substantially co-planar in an exemplary embodiment. The second insulating layer 1162 may comprise, for example, any of $SiO_2$ and $Si_3N_4$ Referring to FIG. 12A-E, the dummy gates 384 may be removed, the SiGe layer 120 underlying the dummy gates 384 may be selectively removed, the selectively removed SiGe layer 120 may be replaced by a third insulator 1224, and the dielectric caps 180 overlying the channel regions 154 of the fins 152 may be removed in an exemplary embodiment. Removing the dummy gates 384 and any etch stop layer (not shown) may exposes portions of the SiGe layer 120 and the channel regions 154 of the fins 152, which are covered by their dielectric caps 180. Selective removal of the SiGe layer 120, by, for example, $SF_6$, may undercut and remove the SiGe layer 120 from beneath the channel regions 154 of the fins 152, which are of narrow width. Portions of the SiGe layer 120 underlying the adjacent S/D regions 156 of the fins 152 may also be selectively etched, as shown in FIG. 12C, of an exemplary embodiment.

Referring to FIGS. 12A-C, a third insulator 1224 may be deposited to replace the selectively removed SiGe layer 120, including the SiGe layer 120 disposed beneath the channel regions 154 of the fins 152 in an exemplary embodiment. The third insulator 1224 may be juxtaposed to the first insulator 922. Thus, the third insulator 1224 and the first insulator 922 may provide isolation of the channel region 154, i.e., the gate region, and the S/D regions 156 of the FinFET from the underlying Si layer 110. The third insulator 1224 may comprise, for example, any of $SiO_2$ and $Si_3N_4$.

Following deposition of the third insulator 1224, the dielectric caps 180 that overlie the channel regions 154 of the fins 152 may be removed, to expose the underlying channel regions 154, i.e., gate regions, in an exemplary embodiment.

Figure 13E:
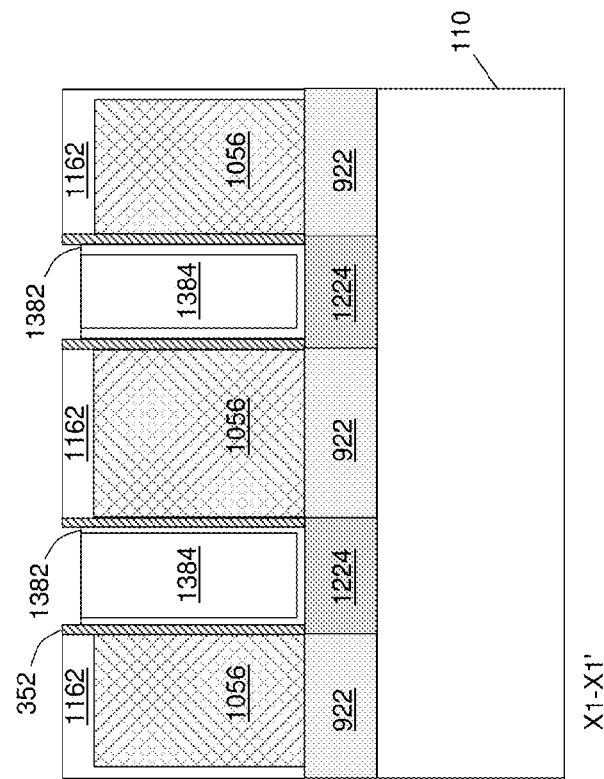
FIG. 13E is a cross section of the X1-X1' axis of FIG. 13A illustrating deposition of the conformal dielectric and the gate stack to form the FinFET in the another exemplary embodiment.
Figure 13D:
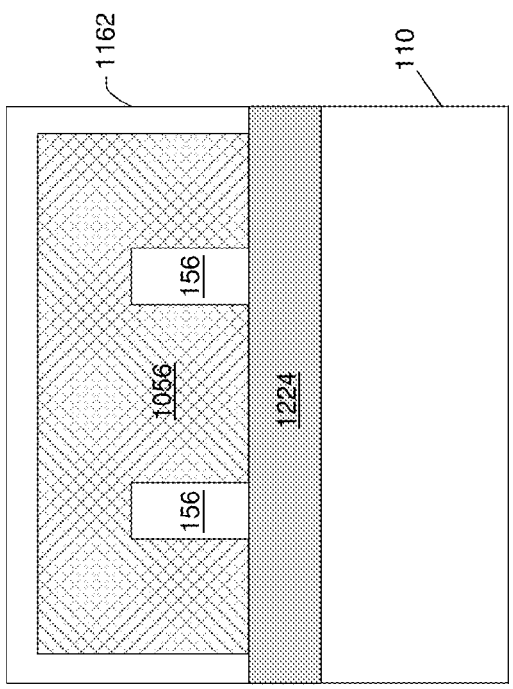
FIG. 13D is a cross section of the Y1-Y1' axis of FIG. 13A illustrating deposition of the conformal dielectric and the gate stack to form the FinFET in the another exemplary embodiment.

Referring to FIGS. 13A-E, a conformal dielectric 1382 is deposited on the sidewalls 352, the third insulator 1224, and the channel regions 154, i.e., gate regions, of the fins 152 in an exemplary embodiment. The conformal dielectric 1382 may form gate dielectrics over the channel regions 154 of the fins 152. As shown in FIGS. 13B and 13C, gate stacks 1384 may then be formed over the conformal dielectric 1382. The gate stacks 1384 may comprise one or more layers comprising, for example, silicon oxynitrides, hafnium silicates, or hafnium oxides, followed by electrical conductors, such as TiN.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

For purposes herein, a "semiconductor" is a material or structure that may include an implanted impurity that allows the material to sometimes be a conductor and sometimes be an insulator, based on electron and hole carrier concentration. As used herein, "implantation processes" can take any appropriate form (whether now known or developed in the future) and can comprise, for example, ion implantation, etc.

For purposes herein, an "insulator" is a relative term that means a material or structure that allows substantially less (<95%) electrical current to flow than does a "conductor." The dielectrics (insulators) mentioned herein can, for example, be grown from either a dry oxygen ambient or steam and then patterned. Alternatively, the dielectrics herein may be formed from any of the many candidate high dielectric constant (high-k) materials, including but not limited to silicon nitride, silicon oxynitride, a gate dielectric stack of SiO2 and Si3N4, and metal oxides like tantalum oxide. The thickness of dielectrics herein may vary contingent upon the required device performance. The conductors mentioned herein can be formed of any conductive material, such as polycrystalline silicon (polysilicon), amorphous silicon, a combination of amorphous silicon and polysilicon, and polysilicon-germanium, rendered conductive by the presence of a suitable dopant. Alternatively, the conductors herein may be one or more metals, such as tungsten, hafnium, tantalum, molybdenum, titanium, or nickel, or a metal silicide, any alloys of such metals, and may be deposited using physical vapor deposition, chemical vapor deposition, or any other technique known in the art.

Within a transistor, the semiconductor (or channel region) is positioned between a conductive "source" region and a similarly conductive "drain" region and when the semiconductor is in a conductive state, the semiconductor allows electrical current to flow between the source and drain. A "gate" is a conductive element that is electrically separated from the semiconductor by a "gate oxide" (which is an insulator) and current/voltage within the gate changes the conductivity of the channel region of the transistor.

A positive-type transistor "P-type transistor" uses impurities such as boron, aluminum or gallium, etc., within an intrinsic semiconductor substrate (to create deficiencies of valence electrons) as a semiconductor region. Similarly, an "N-type transistor" is a negative-type transistor that uses impurities such as antimony, arsenic or phosphorous, etc., within an intrinsic semiconductor substrate (to create excessive valence electrons) as a semiconductor region.

Generally, transistor structures are formed by depositing or implanting impurities into a substrate to form at least one semiconductor channel region, bordered by shallow trench isolation regions below the top (upper) surface of the substrate. A "substrate" herein can comprise any material appropriate for the given purpose (whether now known or developed in the future) and can comprise, for example, Si, SiC, SiGe, SiGeC, Ge alloys, GaAs, InAs, TnP, other III-V or II-VI compound semiconductors, or organic semiconductor structures, etc.

A hardmask can be formed of any suitable material, whether now known or developed in the future, such as a metal or organic hardmask, that has a hardness greater than the substrate and insulator materials used in the remainder of the structure.

When patterning any material herein, the material to be patterned can be grown or deposited in any known manner and a patterning layer (such as an organic photoresist) can be formed over the material. The patterning layer (resist) can be exposed to some form of light radiation (e.g., patterned exposure, laser exposure, etc.) provided in a light exposure pattern, and then the resist is developed using a chemical agent. This process changes the characteristic of the portion of the resist that was exposed to the light. Then one portion of the resist can be rinsed off, leaving the other portion of the resist to protect the material to be patterned. A material removal process is then performed (e.g., plasma etching, etc.) to remove the unprotected portions of the material to be patterned. The resist is subsequently removed to leave the underlying material patterned according to the light exposure pattern.

While only one or a limited number of transistors are illustrated in the drawings, those ordinarily skilled in the art would understand that many different types transistor could be simultaneously formed with the embodiment herein and the drawings are intended to show simultaneous formation of multiple different types of transistors; however, the drawings have been simplified to only show a limited number of transistors for clarity and to allow the reader to more easily recognize the different features illustrated. This is not intended to limit the embodiments because, as would be understood by those ordinarily skilled in the art, the embodiments herein are applicable to structures that include many of each type of transistor shown in the drawings.

In addition, terms such as "right", "left", "vertical", "horizontal", "top", "bottom", "upper", "lower", "under", "below", "underlying", "over", "overlying", "parallel", "perpendicular", etc., used herein are understood to be relative locations as they are oriented and illustrated in the drawings (unless otherwise indicated). Terms such as "touching", "on", "in direct contact", "abutting", "directly adjacent to", etc., mean that at least one element physically contacts another element (without other elements separating the described elements).

What is claimed is:

1. A method for manufacturing a fin field effect transistor (FinFET), comprising:
    forming a dummy gate over a portion of a silicon (Si) fin of said FinFET, said fin being formed on a silicon germanium (SiGe) layer, which contacts a crystalline Si substrate devoid of an insulator;
    forming source/drain (S/D) regions on each side of said dummy gate in said Si fin;
    depositing extrinsic S/D regions on said S/D regions of said Si fin and portions of said SiGe layer not covered by said dummy gate;
    removing said dummy gate and exposing a channel region of said Si fin and portions of said SiGe layer orthogonal to said channel region;
    removing portions of said SiGe layer from beneath said channel region, removing portions of said SiGe layer adjacent to ends of said channel region that underlie portions of said S/D regions of said Si fin, and removing portions of said SiGe layer that are exposed and orthogonal to said channel region, and replacing said portions of said SiGe layer that are removed with an insulator to electrically isolate said channel region and said portions of said S/D regions adjacent to said channel region of said Si fin from said crystalline Si substrate;
    depositing a conformal dielectric on said channel region of said Si fin and said insulator; and
    filling a space delimited by said conformal dielectric with a gate stack over said channel region of said Si fin.

2. The method of claim 1, further comprising: initially etching a dielectric cap and a Si layer, which underlies said dielectric cap, to form said Si fin.

3. The method of claim 2, further comprising transversely forming a rectangular etch stop to cover said portion of said Si fin, before said forming of said dummy gate.

4. The method of claim 2, further comprising removing said dielectric cap from portions of said Si fin not covered by said dummy gate, before said forming of said S/D regions.

5. The method of claim 1, said forming of said S/D regions comprising one of: implanting n-type ions in said S/D regions to form an n-type FinFET, and implanting p-type ions in said S/D regions to form a p-type FinFET.

6. The method of claim 1, further comprising forming an upper insulating layer on said extrinsic S/D regions and said dummy gate, and planarizing said upper insulating layer to expose a top surface of said dummy gate, before said removing of said dummy gate.

7. A method for manufacturing a fin field effect transistor (FinFET), comprising:
    forming a dummy gate over a portion of a channel region of a silicon (Si) fin of said FinFET, said Si fin being formed on a silicon germanium (SiGe) layer, which contacts a crystalline Si substrate devoid of an insulator;
    removing first portions of said SiGe layer not covered by said dummy gate including regions of said Si fin other than said channel region and removing first portions of said SiGe layer that are exposed and disposed orthogonally to said Si fin, and replacing said first portions of said SiGe layer that are removed with a first insulator;

forming S/D regions one each side of said dummy gate in said Si fin;

depositing extrinsic S/D regions on said S/D regions of said Si fin and on portions of said first insulator not covered by said dummy gate;

removing said dummy gate and exposing said channel region of said Si fin and portions of said SiGe layer orthogonal to said channel region;

removing second portions of said SiGe layer from beneath said channel region and from portions of said SiGe layer orthogonal to said channel region, and replacing said second portions of said SiGe layer that are removed with a second insulator to electrically isolate said channel region from said crystalline Si substrate by said first insulator and said second insulator;

depositing a conformal dielectric on said channel region of said Si fin and said second insulator; and filling a space delimited by said conformal dielectric with a gate stack over said channel region of said Si fin.

8. The method of claim 7, said replacing said second portions of said SiGe layer that are removed with said second insulator, juxtaposing side surfaces of said first insulator and said second insulator.

9. The method of claim 7, further comprising: initially etching a dielectric cap and a Si layer, which underlies said dielectric cap, to form said Si fin.

10. The method of claim 7, further comprising removing said dielectric cap from portions of said Si fin not covered by said dummy gate, before said forming of said S/D regions.

11. The method of claim 7, said forming of said S/D regions comprising one of: implanting n-type ions in said S/D regions to form an n-type FinFET, and implanting p-type ions in said S/D regions to form a p-type FinFET.

12. The method of claim 7, further comprising forming an upper insulating layer on said extrinsic S/D regions and said dummy gate, and planarizing said upper insulating layer to expose a top surface of said dummy gate, before said removing of said dummy gate.

* * * * *